(12) United States Patent
Miller

(10) Patent No.: US 10,505,322 B2
(45) Date of Patent: Dec. 10, 2019

(54) COMMUNICATION SYSTEM HAVING COAXIAL CONNECTOR ASSEMBLY

(71) Applicant: TE CONNECTIVITY CORPORATION, Berwyn, PA (US)

(72) Inventor: Keith Edwin Miller, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/221,688

(22) Filed: Dec. 17, 2018

(65) Prior Publication Data

US 2019/0229475 A1     Jul. 25, 2019

Related U.S. Application Data

(63) Continuation-in-part of application No. 15/981,137, filed on May 16, 2018.

(Continued)

(51) Int. Cl.
| | |
|---|---|
| *H01R 13/512* | (2006.01) |
| *H01R 24/38* | (2011.01) |
| *H01R 13/631* | (2006.01) |
| *H01R 13/516* | (2006.01) |
| *H01R 13/74* | (2006.01) |

(Continued)

(52) U.S. Cl.
CPC ........... *H01R 24/38* (2013.01); *H01R 13/516* (2013.01); *H01R 13/6315* (2013.01); *H01R 13/2421* (2013.01); *H01R 13/74* (2013.01); *H01R 24/40* (2013.01)

(58) Field of Classification Search
CPC .................................................. H01R 13/516

USPC ....... 439/901, 903, 737, 738, 701, 247, 248; 429/737, 738, 701, 247, 248

See application file for complete search history.

(56) References Cited

U.S. PATENT DOCUMENTS

| | | | | |
|---|---|---|---|---|
| 1,034,910 A | * | 8/1912 | Greenway | H01R 13/64 439/680 |
| 1,536,082 A | | 5/1925 | Douglas | |

(Continued)

FOREIGN PATENT DOCUMENTS

| | | |
|---|---|---|
| DE | 198 44 281 A1 | 5/2000 |
| EP | 2 354 824 A1 | 8/2011 |

(Continued)

OTHER PUBLICATIONS

Annex to European Search Report, dated Jun. 6, 2019 , EP 19 15 2568, Application No. 19152568.2-1201.

*Primary Examiner* — Neil Abrams

(57) ABSTRACT

A coaxial connector assembly includes a connector module having a connector body having a first side edge including a first slot. The connector body has contact channels holding coaxial contacts. The coaxial connector assembly includes a mounting frame having a first side wall including a second slot and a second side wall having a blocking surface supporting the connector body in a recess. The second slot is open to the recess. The coaxial connector assembly includes a side support removably received in the first and second slots. The side support has a side support surface. The side support passes through the second slot and extends into the first slot such that the side support surface supports the first side edge of the connector body in the recess. The side support may be formed as a threaded fastener.

20 Claims, 14 Drawing Sheets

Related U.S. Application Data

(60) Provisional application No. 62/619,357, filed on Jan. 19, 2018.

(51) Int. Cl.
*H01R 24/40* (2011.01)
*H01R 13/24* (2006.01)

(56) References Cited

U.S. PATENT DOCUMENTS

| | | | | |
|---|---|---|---|---|
| 1,580,879 | A * | 4/1926 | Evans | H01R 24/58 |
| | | | | 439/248 |
| 1,703,046 | A * | 2/1929 | Paiste | H01R 13/59 |
| | | | | 439/462 |
| 1,875,378 | A * | 9/1932 | Hastings | H01R 13/68 |
| | | | | 337/198 |
| 2,000,318 | A * | 5/1935 | Cannon | H01R 13/6275 |
| | | | | 439/270 |
| 2,374,971 | A * | 5/1945 | Benander | H01R 13/56 |
| | | | | 174/59 |
| 2,404,682 | A * | 7/1946 | Baker | H01R 13/193 |
| | | | | 174/21 JS |
| 2,410,618 | A * | 11/1946 | Zelov | H01R 24/22 |
| | | | | 174/51 |
| 2,659,872 | A * | 11/1953 | Gilbert | H01R 13/631 |
| | | | | 439/248 |
| 2,677,811 | A | 5/1954 | Anderson et al. | |
| 2,801,395 | A * | 7/1957 | Quackenbush | H01R 13/56 |
| | | | | 439/589 |
| 3,002,175 | A | 9/1961 | Bertram et al. | |
| 3,128,138 | A * | 4/1964 | Noschese | H01R 13/648 |
| | | | | 439/579 |
| 3,177,464 | A | 4/1965 | Solorow et al. | |
| 3,266,006 | A * | 8/1966 | Abbott | H01R 13/533 |
| | | | | 285/187 |
| 3,277,421 | A * | 10/1966 | Gobrecht | B61G 5/10 |
| | | | | 213/1.3 |
| 3,562,696 | A | 2/1971 | Barnhart et al. | |
| 3,566,334 | A | 2/1971 | Ziegler, Jr. | |
| 3,668,608 | A | 6/1972 | Ziegler, Jr. | |
| 3,671,921 | A | 6/1972 | Baker, III et al. | |
| 3,851,946 | A * | 12/1974 | Piaget | H01R 13/6278 |
| | | | | 439/347 |
| 4,106,834 | A * | 8/1978 | Horowitz | H01R 13/533 |
| | | | | 439/142 |
| 4,232,930 | A * | 11/1980 | Teti | H01R 13/502 |
| | | | | 439/172 |
| 4,392,699 | A | 7/1983 | Weingartner | |
| 4,407,553 | A * | 10/1983 | Dvorachek | H01R 13/512 |
| | | | | 439/752 |
| 4,413,875 | A | 11/1983 | Mattingly | |
| 4,630,876 | A * | 12/1986 | Grunberg | H01R 24/84 |
| | | | | 439/293 |
| 4,659,162 | A | 4/1987 | Cartesse | |
| 4,659,164 | A * | 4/1987 | Reuss | H01R 23/26 |
| | | | | 439/460 |
| 4,764,130 | A | 8/1988 | DiClemente | |
| 4,927,388 | A | 5/1990 | Gutter | |
| 4,938,718 | A * | 7/1990 | Guendel | H01R 13/6456 |
| | | | | 439/320 |
| 4,940,417 | A | 7/1990 | Hyogo et al. | |
| 5,000,693 | A * | 3/1991 | Hatagishi | H01R 13/66 |
| | | | | 439/248 |
| 5,067,908 | A * | 11/1991 | Guth | H01R 13/631 |
| | | | | 439/248 |
| 5,192,224 | A * | 3/1993 | Bernardini | H01R 13/5808 |
| | | | | 439/464 |
| 5,217,386 | A * | 6/1993 | Ohsumi | H01R 13/6215 |
| | | | | 439/248 |
| 5,217,391 | A | 6/1993 | Fisher, Jr. | |
| 5,383,790 | A | 6/1995 | Kerek et al. | |
| 5,590,229 | A | 12/1996 | Goldman et al. | |
| 5,651,683 | A * | 7/1997 | Shimamura | H01R 13/6315 |
| | | | | 174/72 A |
| 5,671,311 | A | 9/1997 | Stille et al. | |
| 5,689,598 | A | 11/1997 | Dean, Jr. et al. | |
| 5,746,617 | A * | 5/1998 | Porter, Jr. | H01R 13/6315 |
| | | | | 439/248 |
| 5,791,939 | A * | 8/1998 | Tanigawa | H01R 9/0518 |
| | | | | 439/607.01 |
| 6,471,543 | B1 * | 10/2002 | Balcombe | H01R 13/745 |
| | | | | 439/362 |
| 6,485,194 | B1 | 11/2002 | Shirakawa | |
| 6,517,380 | B1 * | 2/2003 | Deutsch | H01R 13/5202 |
| | | | | 439/598 |
| 6,733,317 | B2 * | 5/2004 | Sato | B41J 29/02 |
| | | | | 439/246 |
| 6,827,597 | B1 * | 12/2004 | Metzbower | H01R 13/502 |
| | | | | 439/320 |
| 7,033,211 | B2 * | 4/2006 | Bartholoma | H01R 13/502 |
| | | | | 439/572 |
| 7,063,546 | B2 * | 6/2006 | Akino | H01R 13/652 |
| | | | | 439/620.21 |
| 7,070,458 | B2 | 7/2006 | Axenbock et al. | |
| 7,485,012 | B2 | 2/2009 | Daugherty et al. | |
| 7,517,234 | B2 * | 4/2009 | Akino | H01R 13/512 |
| | | | | 439/106 |
| 7,581,984 | B2 | 9/2009 | Moyon et al. | |
| 8,066,531 | B2 * | 11/2011 | Kanatsu | H01R 13/6588 |
| | | | | 439/607.34 |
| 8,182,297 | B2 | 5/2012 | Lin | |
| 8,360,807 | B2 | 1/2013 | Buff et al. | |
| 9,130,328 | B1 | 9/2015 | Huang et al. | |
| 9,362,638 | B2 | 6/2016 | Ljubijankic et al. | |
| 9,368,883 | B2 | 6/2016 | Chiang et al. | |
| 9,444,169 | B2 | 9/2016 | Gates | |
| 9,627,782 | B2 | 4/2017 | Fackler | |
| 9,735,519 | B2 | 8/2017 | Yi et al. | |
| 10,116,093 | B2 | 10/2018 | Ishibashi | |
| 2004/0253869 | A1 | 12/2004 | Yamaguchi et al. | |
| 2009/0028495 | A1 | 1/2009 | Anrig et al. | |
| 2011/0188810 | A1 | 8/2011 | Ciechomski et al. | |
| 2013/0236142 | A1 | 9/2013 | Fabian et al. | |
| 2014/0308008 | A1 | 10/2014 | Mougin et al. | |
| 2015/0234127 | A1 | 8/2015 | Chen et al. | |
| 2016/0116695 | A1 | 4/2016 | Nekado et al. | |
| 2017/0170611 | A1 | 6/2017 | Yi et al. | |
| 2019/0229476 | A1 * | 7/2019 | Miller | H01R 9/0515 |

FOREIGN PATENT DOCUMENTS

| | | |
|---|---|---|
| WO | 2015/038413 A1 | 3/2015 |
| WO | 2017/100573 A1 | 6/2017 |

* cited by examiner

COMMUNICATION SYSTEM HAVING COAXIAL CONNECTOR ASSEMBLY

CROSS REFERENCE TO RELATED APPLICATIONS

This application is a continuation-in-part application of U.S. application Ser. No. 15/981,137 filed May 16, 2018, which claims benefit to U.S. Provisional Application No. 62/619,357, filed Jan. 19, 2018, the subject matter of each of which are herein incorporated by reference in their entirety.

BACKGROUND

The subject matter described and/or illustrated herein relates generally to communication systems having coaxial connector assemblies.

Coaxial connectors are known for interconnecting various coaxial components, such as coaxial cables, circuit boards, and/or the like. Coaxial connectors include one or more coaxial contact pairs. Each coaxial contact pair includes a signal element and a ground element that is arranged coaxially with the signal element. A coaxial contact pair is hereinafter referred to as a coaxial contact. Each coaxial contact may have a cable terminated thereto. Coaxial connectors often include an array of coaxial contacts. The coaxial connectors may be used for a wide variety of applications, such as, but not limited to, radio frequency (RF) interconnections. As one example, a backplane communication system may include a large backplane circuit board that includes one or more windows. Each window is configured to receive a coaxial connector that is also mounted to the backplane circuit board using, for example, hardware. As such, the coaxial connectors are presented along one side of the circuit board for mating with corresponding coaxial connectors of a daughter card assembly or assemblies.

Known coaxial connectors are not without disadvantages. For example, it may be desirable to have coaxial connectors that have a greater density of coaxial contacts. Even with greater densities, however, it may be difficult to mate the opposing coaxial connectors. For example, the coaxial contacts of one coaxial connector include signal pins that are exposed within socket cavities of the coaxial contacts. The signal pins are at risk of being damaged if the coaxial connectors are not sufficiently aligned during the mating operation.

Accordingly, there is a need for a coaxial connector having a greater density of coaxial contacts that also enables alignment of the coaxial contacts during the mating operation.

BRIEF DESCRIPTION

In an embodiment, a coaxial connector assembly is provided including a connector module having a connector body extending between a front side and a rear side. The connector body has side edges between the front side and the rear side including a first side edge including a first slot in the first side edge located between the front side and the rear side. The connector body has contact channels therethrough between the front side and the rear side holding coaxial contacts in corresponding contact channels that are presented along the front side for engaging corresponding mating contacts of a mating connector facing in a mating direction along a mating axis. The coaxial connector assembly includes a mounting frame having a passage extending between a mating side and a mounting side of the mounting frame that face in opposite directions. The mounting frame has side walls between the mating side and the mounting side. The side walls include a first side wall including a second slot located between the mating side and the mounting side and a second side wall having a blocking surface supporting the connector body in the passage. The mounting side faces in a mounting direction along the mating axis and is configured to interface with a support wall. The passage has a recess that receives the connector body. The second slot is open to the recess. The coaxial connector assembly includes a side support removably received in the first and second slots. The side support has a side support surface. The side support passes through the second slot and extends into the first slot such that the side support surface supports the first side edge of the connector body in the recess.

In another embodiment, a coaxial connector assembly is provided including a connector module having a connector body extending between a front side and a rear side. The connector body has side edges between the front side and the rear side including a first side edge including a first slot in the first side edge located between the front side and the rear side. The connector body has contact channels therethrough between the front side and the rear side holding coaxial contacts in corresponding contact channels that are presented along the front side for engaging corresponding mating contacts of a mating connector facing in a mating direction along a mating axis. The coaxial connector assembly includes a mounting frame having a passage extending between a mating side and a mounting side of the mounting frame that face in opposite directions. The mounting frame has side walls between the mating side and the mounting side. The side walls include a first side wall including a second slot located between the mating side and the mounting side and a second side wall having a blocking surface supporting the connector body in the passage. The mounting side faces in a mounting direction along the mating axis and is configured to interface with a support wall. The passage has a recess that receives the connector body. The second slot is open to the recess. The coaxial connector assembly includes a support pin removably received in the bores of the first and second slots. The support pin has a side support surface engaging the connector body and supporting the connector body in the recess. The support pin passes through the second slot into the first slot to support the connector body in the recess.

In a further embodiment, a communication system is provided including a first coaxial connector assembly and a second coaxial connector assembly. The first coaxial connector assembly includes a first connector module having a first connector body holding first coaxial cable assemblies having mating contacts having mating ends terminated to ends of cables. The second coaxial connector assembly includes a second connector module having a second connector body holding second coaxial cable assemblies having coaxial contacts having mating ends terminated to ends of cables configured to be mated with the mating contacts. The second connector body extends between a front side and a rear side and has side edges between the front side and the rear side. The side edges include a first side edge including a first slot located between the front side and the rear side. The second connector body has contact channels therethrough between the front side and the rear side holding corresponding coaxial contacts. The second coaxial connector assembly includes a mounting frame having a mating side and a mounting side that face in opposite directions and having side walls between the mating side and the mounting side. The side walls include a first side wall including a second slot located between the mating side and the mounting side and a second side wall having a blocking surface supporting the second connector body in the passage. The mounting side faces in a mounting direction along the mating axis and configured to interface with a support wall. The mounting frame defines a passage therethrough having a recess that receives the second connector body. The second slot is open to the recess. The second coaxial connector assembly includes a support pin removably received in the bores of the first and second slots. The support pin has a side support surface engaging the second connector body and supporting the second connector body in the recess. The support pin passes through the second slot into the first slot to support the second connector body in the recess.

DETAILED DESCRIPTION

Embodiments set forth herein include coaxial connector assemblies and communication systems that include such coaxial connector assemblies. The communication system may include, for example, a circuit board that is secured to the coaxial connector assembly. In some embodiments, the communication system is a backplane (or midplane) communication system. As used herein, the terms backplane and midplane are used interchangeably and represent a system interface for multiple daughter card assemblies (e.g., line cards or switch cards). In other embodiments, the communication system is a circuit board assembly (e.g., daughter card assembly). One or more embodiments permit a connector module of the connector assembly to float during a mating operation. One or more embodiments enable using a denser grouping of coaxial contacts by permitting the coaxial contacts to be rear-loaded into the connector module. In particular embodiments, the connector module is permitted to float and also enables rear-loading of coaxial contacts.

As used herein, phrases such as "a plurality of [elements]," "a set of [elements]," "an array of [elements]," and the like, when used in the detailed description and claims, do not necessarily include each and every element that a component may have. For instance, the phrase "the connector module having a plurality of coaxial contacts that include [a recited feature]" does not necessarily mean that each and every coaxial contact of the connector module has the recited feature. Instead, only some of the coaxial contacts may have the recited feature and other coaxial contacts of the connector module may not include the recited feature. As another example, the detailed description or the claims may recite that a connector assembly includes "a cable assemblies, each of which including a [recited feature]." This phrase does not exclude the possibility that other cable assemblies of the connector assembly may not have the recited feature. Accordingly, unless explicitly stated otherwise (e.g., "each and every cable assembly of the connector module"), embodiments may include similar elements that do not have the same features.

Figure 1:
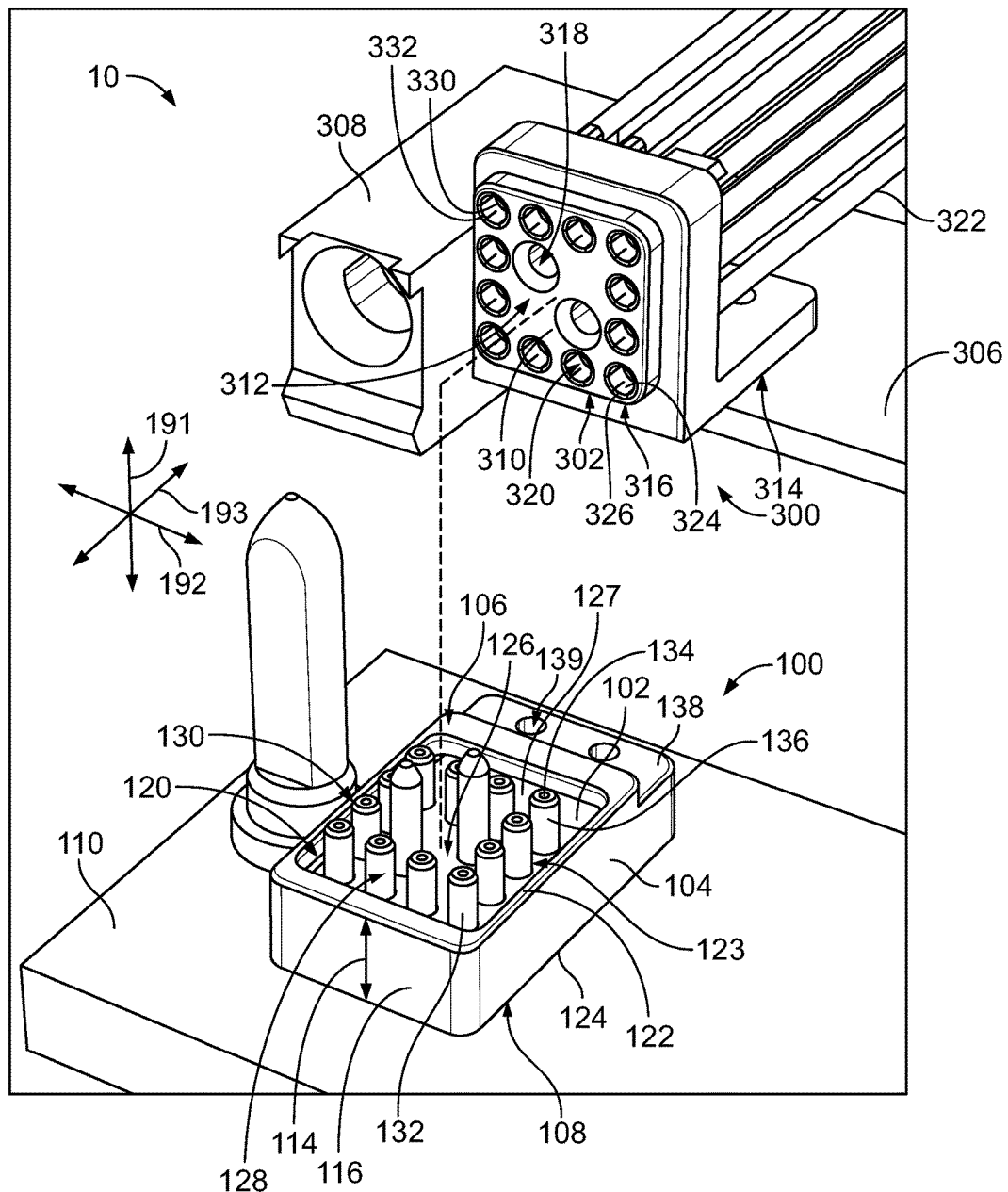
FIG. 1 is a perspective view of a communication system formed in accordance with an exemplary embodiment showing a coaxial connector assembly and a coaxial connector assembly in an unmated state.
Figure 2:
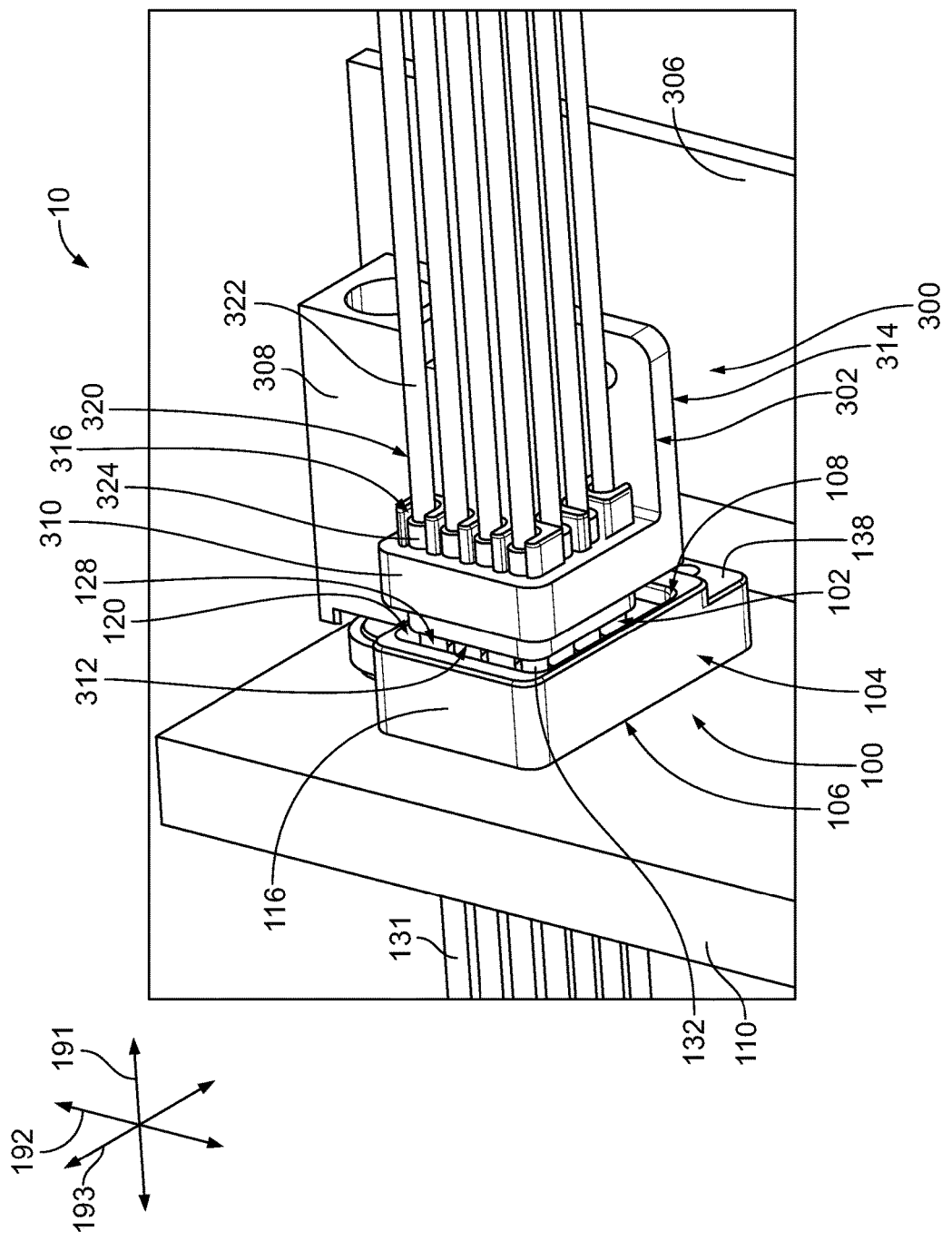
FIG. 2 is a perspective view of the communication system showing the coaxial connector assemblies mated together.

FIG. 1 is a perspective view of a communication system 10 formed in accordance with an exemplary embodiment, showing a coaxial connector assembly 100 and a coaxial connector assembly 300 in an unmated state. FIG. 2 is a perspective view of the communication system 10 showing the coaxial connector assemblies 100, 300 mated together. The coaxial connector assemblies 100, 300 are configured to be mated along a mating axis.

In some applications, the coaxial connector assemblies 100, 300 may be referred to more generally as a circuit board assemblies. The communication system 10 may be configured for radiofrequency (RF) applications. In particular embodiments, the communication system 10 and/or its components, such as the connector assembly 100 and/or 300, are configured to satisfy military and aerospace applications. For example, the components of the communication system 10 may be configured to satisfy one or more industry or government standards, such as MIL-STD-348. To illustrate one example of the communication system 10, the connector assemblies 100, 300 may form an interconnect between analog and digital sections of a radio. The connector assembly 300 may perform analog functions. The connector assembly 300 may be replaced with other connector assemblies that are configured to perform the same or different operations. The digital functions, including digital signal processing, may be performed by a communication component (not shown) that is coupled to the connector assembly 100. The other communication component may be another daughter card assembly (not shown).

The communication system 10 and/or its components (e.g., the connector assembly 100 and/or 300) may be configured to satisfy one or more industry or government standards. By way of example only, embodiments may be configured to satisfy the VME International Trade Association (VITA) standards (e.g., VITA 48, VITA 67, et al.). The communication system 10 and/or its components may have an operating speed that achieves 50 GHz or greater. In particular embodiments, the communication system 10 and/or its components may achieve an operating speed of 60 GHz or greater. It should be understood, however, that other embodiments may be configured for different standards and may be configured to operate at different speeds. In some configurations, embodiments may be configured to operate within the range of DC to 60.0 GHz.

In an exemplary embodiment, the coaxial connector assembly 300 is a daughter card assembly having a connector module 302 and a substrate 306. The connector module 302 is mounted to the substrate 306. The substrate 306 may be a circuit card, such as a daughter card. The coaxial connector assembly 300 includes a guide module 308 mounted to the substrate 306 proximate to the connector module 302. The guide module 308 is used to guide mating with the coaxial connector assembly 100. In the illustrated embodiment, the guide module 308 includes an opening configured to receive an alignment pin. The opening may be chamfered or have a lead-in.

The connector module 302 includes a connector body 310 holding coaxial cable assemblies 320. The connector body 310 extends between a mating end 312 and a mounting end 314. Optionally, the mounting end 314 may be oriented perpendicular to the mating end 312. The mounting end 314 is mounted to the substrate 306. In the illustrated embodiment, the mating end 312 is oriented perpendicular to the substrate 306. The connector body 310 includes a plurality of contact channels 316 receiving corresponding coaxial cable assemblies 320. The connector body 310 includes alignment features 318 for aligning the connector module 302 with the coaxial connector assembly 100 during mating. In the illustrated embodiment, the alignment features 318 are openings and may be referred to hereinafter as openings 318. Other types of alignment features may be provided in alternative embodiments.

Each coaxial cable assembly 320 includes a cable 322 and a coaxial contact 324 terminated to the end of the cable 322 and the coaxial contact 324 has a mating end 326 for mating with the coaxial connector assembly 100. In an exemplary embodiment, the coaxial contact 324 is an RF contact. The coaxial contact 324 includes an inner contact 330 and an outer contact 332 surrounding the inner contact 330. The inner contact 330 is configured to be terminated to a conductor of the cable 322. The outer contact 332 is configured to be terminated to a shield, such as a cable braid, of the cable 322. Other arrangements are possible in alternative embodiments. In alternative embodiments, the connector assembly 300 does not include the cables 322 that directly couple to the coaxial contacts 324. For example, the coaxial contacts 324 may directly terminate to the substrate 306 (for example, the daughtercard) and/or may be communicatively coupled to cables through traces and vias (not shown) of the substrate 306.

For reference, the coaxial connector assembly 100 is oriented with respect to mutually perpendicular axes 191-193, which includes a mating axis 191, a first lateral axis 192, and a second lateral axis 193 (the coaxial connector assembly 300 is illustrated in FIG. 1 rotated 90° relative to the mating direction shown in in FIG. 2). The first and second lateral axes 192, 193 may define a lateral plane. As used herein, if an element moves "laterally" or in a "lateral direction," the movement may be in any direction along the lateral plane. For example, the movement may be parallel to the first lateral axis 192, parallel to the second lateral axis 193, or in a direction with a component along the first lateral axis 192 and a component along the second lateral axis 193. The coaxial connector assembly 100 may have any orientation with respect to gravity.

The connector assembly 100 includes a connector module 102 and a mounting frame 104 that are operably coupled to each other. The connector module 100 is mounted to a support wall 110. The support wall 110 may be, for example, a circuit board (for example, a backplane circuit board), a panel, or another type of wall. The mounting frame 104 is used to secure the connector module 102 to the support wall 110. In an exemplary embodiment, the mounting frame 104 is slightly oversized relative to the connector module 102 such that the connector module 102 has a limited amount of floating movement relative to the mounting frame 104, such as for alignment with the coaxial connector assembly 300 during mating. During operation or usage of the connector assembly 100, a portion of the connector module 102 is floatably held in the mounting frame 104, to allow relative movement between the support wall 110 and the connector module 102. For example, the connector module 102 is permitted to move latlerally (e.g., in a lateral direction) during a mating operation (for example, parallel to the plane of the support wall 110). The lateral direction may be parallel to the first lateral axis 192 or parallel to the second lateral axis 193. However, it should be understood, that the lateral direction may be any direction that is perpendicular to the mating axis 191 or parallel to a plane defined by the first and second lateral axes 191, 192.

The mounting frame 104 includes opposite mating and mounting sides 106, 108. More specifically, the mating side 106 is configured to face in a mating direction (for example, forward) along the mating axis 191, and the mounting side 108 is configured to face in a mounting direction (for example, rearward) along the mating axis 191 that is opposite the mating direction. The mounting frame 104 has a thickness 114 that is defined between the mating and mounting sides 106, 108. The mounting frame 104 has an outer frame edge defined by side walls 116 that defines an outer perimeter or border of the mounting frame 104. In the illustrated embodiment, the mounting frame 104 has a substantially rectangular profile that is defined by the side walls 116, but the mounting frame 104 may have profiles with other shapes in alternative embodiments.

Also shown, the mounting frame 104 includes a passage 120 that extends through the mating and mounting sides 106, 108. The passage 120 is sized and shaped to receive a portion of the connector module 102. For example, the mounting frame 104 includes a front edge 122 (FIG. 1) along the mating side 106, and a back edge 124 (FIG. 3) along the mounting side 108. The front edge 122 defines a front opening 123 (FIG. 1) to the passage 120, and the back edge 124 defines a back opening 125 (FIG. 3) to the passage 120. The passage 120 extends between the front and back openings 123, 125.

In an exemplary embodiment, the front and back edges 122, 124 are dimensioned to form blocking surfaces (described below) that engage the connector module 102 and retain the connector module 102 in the mounting frame 104. The blocking surfaces prevent the connector module 102 from passing freely through the passage 120. The blocking surfaces may also prevent the connector module 102 from moving laterally beyond a confined space. For example, the blocking surfaces form boundaries that define the limited amount of floating movement of the connector module 102 relative to the mounting frame 104.

The connector module 102 includes a connector body 126 having a front side 127 and a rear side 129 (FIG. 3) that face in the mating direction and the mounting direction, respectively. The connector module 102 also includes a contact array 130 of coaxial contacts 132 that are coupled to the connector body 126. In particular embodiments, a pitch (or center-to-center spacing) between adjacent coaxial contacts 132 may be between 1.50 mm and 5.00 mm. In particular embodiments, the pitch may be between 2.00 mm and 3.50 mm or, more particularly, between 2.50 mm and 2.9 mm. In other embodiments, however, the pitch may be greater or smaller.

The connector body 126 holds the coaxial contacts 132 at designated positions for engaging corresponding coaxial contacts 324 (FIG. 1). In the illustrated embodiment, the coaxial contacts 132 are elements of corresponding coaxial cable assemblies 128. The coaxial contacts 132 represent mating ends of the corresponding coaxial cable assemblies 128. Each of the coaxial contacts 132 includes a signal element 134 (FIG. 1) and a ground element 136 (FIG. 1) that is coaxially aligned with the signal element 134. The signal and ground elements 134, 136 may be electrically coupled to signal and ground paths (not shown) through cables 131 of the coaxial cable assemblies 128. The signal element 134 may be a center contact 134 and the ground element 136 may be an outer contact 136.

The mounting frame 104 may include a frame extension 138. The frame extension 138 represents a section of the mounting frame 104 that extends laterally away from the passage 120. The frame extension 138 is configured to interface with the support wall 110. For example, the mounting frame 104 may include posts extending from the mounting side 108 that are received in corresponding openings in the support wall 110 to orient the mounting frame 104 relative to the support wall 110. The frame extension 138 includes one or more through holes 139 that are sized and shaped to receive hardware (e.g., screws, bolts, plugs, and the like) for securing the mounting frame 104 to the support wall 110. In some embodiments, the through holes 139 may be defined by threaded surfaces of the mounting frame 104 for engaging screws. In other embodiments, the surfaces that define the through holes 139 are not threaded. The mounting frame 104 is configured to have a fixed position relative to the support wall 110. The connector module 102, on the other hand, is permitted to float relative to the support wall 110 within the confined space.

Figure 3:
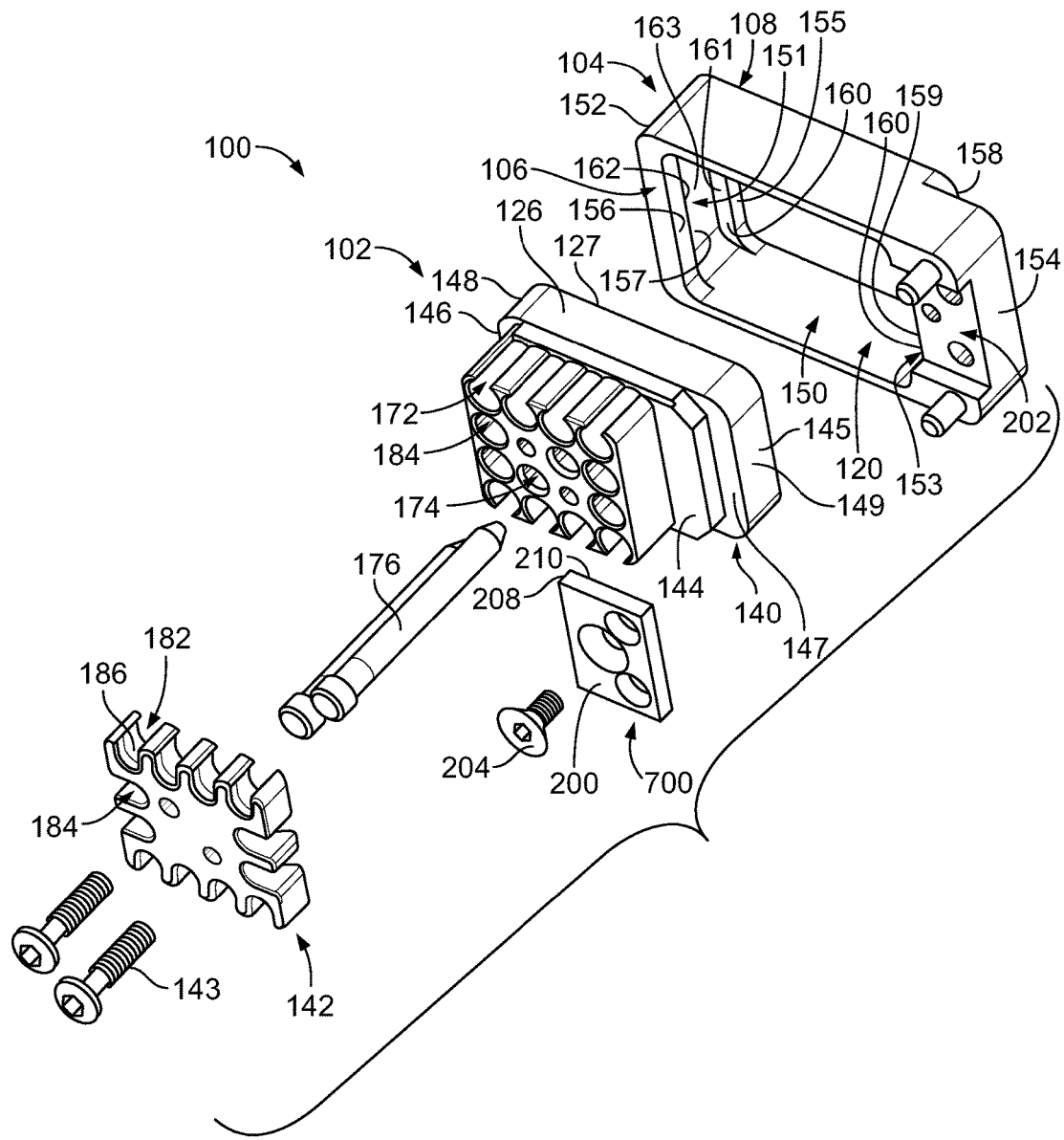
FIG. 3 is an exploded view of the coaxial connector assembly in accordance with an exemplary embodiment.

FIG. 3 is an exploded view of the connector assembly 100. The connector body 126 includes a forward section 140 and a rear section 142. The forward and rear sections 140, 142 are discrete elements that are configured to be secured to each other. In the illustrated embodiment, the forward and rear sections 140, 142 are secured to each other using hardware 143 (e.g., screws), but may be secured to each other in other manners in alternative embodiments. In various embodiments, the hardware 143 are captive screws configured to be held in the rear section 142, such as to make assembly easier and/or to prevent losing the hardware 143 during assembly. The forward section 140 includes a main portion 144 and a flange portion 145 that extends laterally (or radially) away from the main portion 144. The flange portion 145 may be defined by a first lip 146 and a second lip 147 at opposite first and second sides 148, 149. The flange portion 145 may include other lips in alternative embodiments, such as a lip along the top and/or the bottom. In an exemplary embodiment, the flange portion 145 is provided at the front side 127 of the connector body 126. The lips 146, 147 may include rearward-facing surfaces facing in the mounting direction.

The mounting frame 104 includes a connector-receiving recess 150 of the passage 120 that opens along the mounting side 108 to receive the connector body 126. The recess 150 includes a first cavity 151 at a first side wall 152 of the mounting frame 104 and a second cavity 153 at a second side wall 154 of the mounting frame 104. The connector-receiving recess 150 is sized and shaped to receive the main portion 144 of the connector body 126 and the cavities 151, 153 are sized and shaped to receive the flange portion 145, such as the first lip 146 and the second lip 147, respectively. In an exemplary embodiment, the first cavity 151 is defined by a front rim 155 at the mating side 106 and a rear rim 156 at the mounting side 108. The first cavity 151 includes a cavity wall 157 between the front rim 155 and the rear rim 156 at the first end of the recess 150. The first cavity 151 is open at the first side of the recess 150 and is closed or blocked by the front rim 155, the rear rim 156 in the cavity wall 157. In an exemplary embodiment, the second cavity 153 is defined by a front rim 158 at the mating side 106 and a cavity wall 159 opposite the cavity wall 157. The second cavity 153 is open at the mounting side 108, such as for loading the connector body 126 into the recess 150.

The connector-receiving recess 150 is defined by blocking surfaces 160 used to block or retain the connector module 102 in the mounting frame 104. The blocking surfaces 160 may limit or restrict movement of the connector module 102 in an axial direction along the mating axis 191. The blocking surfaces 160 may limit or restrict movement of the connector module 102 in a lateral direction along the lateral axis 192 and/or the lateral axis 193. In an exemplary embodiment, the blocking surfaces 160 are defined by the front rim 155, the rear rim 156, the cavity wall 157, the front rim 158 and the cavity wall 159. The mounting frame 104 may include additional blocking surfaces 160 in alternative embodiments, such as blocking surfaces 160 defined by the top and the bottom of the recess 150. In an exemplary embodiment, the blocking surfaces 160 include front blocking surfaces 161, rear blocking surfaces 162 and end blocking surfaces 163. The front blocking surfaces 161 limit or restrict movement in the mating direction. The rear blocking surfaces 160 to limit or restrict movement in the mounting direction. The end blocking surfaces 163 limit or restrict movement in the lateral direction. In an exemplary embodiment, the front rims 155, 158 define the front blocking surfaces 161, the rear rim 156 defines the rear blocking surface 162 and the cavity walls 157, 159 and the top and the bottom define the end blocking surfaces 163. The end blocking surfaces 163 face in the lateral direction that is perpendicular to the mating axis 191 to limit or restrict movement in the lateral direction. Optionally, the recess 150 may be oversized to allow a limited amount of floating movement in the lateral direction. For example, the end blocking surfaces 163 may be wider than the connector body 126 to allow shifting in at least one of the lateral directions 192, 193. In various embodiments, the end blocking surfaces 163 may permit the connector module 102 to float at least 0.15 mm along a lateral plane. In various embodiments, the connector module 102 may be permitted to float at least 0.25 mm or, more particularly, at least 0.35 mm along the lateral plane. It should be understood, however, that the connector assembly 100 may be configured to permit a greater or lesser amount of floating than the values provided above. The amount of floating movement may be controlled based on manufacturing tolerances of the connector assemblies 100, 300.

The first lip 146 of the flange portion 145 is configured to be retained or trapped between the front and rear rims 155, 156 of the side wall 152 of the mounting frame 104. The blocking surfaces 160 may limit axial movement. Optionally, the connector module 102 may have a limited amount of floating movement in the axial direction between the front and rear rims 155, 156. Alternatively, the first lip 146 may have a tight fit between the front and rear rims 155, 156 such that there is no movement in the axial direction.

In an exemplary embodiment, the connector assembly 100 includes a side support 700 used for supporting the connector body 126 in the recess 150. The side support 700 is separate and discrete from the mounting frame 104. The side support 700 is removably coupled to the mounting frame 104 and is configured to be coupled to the connector body 126, to support the connector body 126, after the connector body 126 is loaded into the recess 150. The side support 700 includes one or more side support surfaces 702 for supporting the connector body 126. The side support 700 is removably received in the recess 150 to interface the side support surface 702 with the connector body 126. The side support 700 is removed from the mounting frame 104, or moved to a clearance position (e.g., non-blocking position), to allow the connector body 126 to be loaded into or removed from the recess 150, such as being pivoted into the recess 150. The side support 700 is coupled to the mounting frame 104, or moved to a blocking position, after the connector body 126 is in the recess 150 to retain the connector body 126 in the recess. In an exemplary embodiment, the side support 700 is a backing plate 200 configured to be coupled to the mounting frame 104. However, other types of side supports 700 may be used in alternative embodiments, such as a support pin, which may be side loaded into and out of the recess 150 to support the connector body 126.

The backing plate 200 is used to secure the connector module 102 and the recess 150. In an exemplary embodiment, the mounting frame 104 includes a pocket 202 at the mounting side 108, such as at the second side wall 154. The pocket 202 is sized and shaped to receive the backing plate 200. Optionally, the backing plate 200 may be loaded into the pocket 202 from behind the mounting frame 104. In alternative embodiments, the backing plate 200 may be loaded into the pocket 202 from the side, such as from the exterior side of the mounting frame 104 or from the interior side in the recess 150. For example, the backing plate 200 may be side loaded into the pocket 202 through a slot formed in the outer edge of the side wall 154. The slot may be closed at the mating side 106 and the mounting side 108, rather than being open at the mounting side 108 (as in the illustrated embodiment). In an exemplary embodiment, the backing plate 200 may be secured to the mounting frame 104, such as using a fastener 204. Other securing means may be used in alternative embodiments.

In an exemplary embodiment, an inner edge 208 of the backing plate 200 may extend into the recess 150 to overlap and retain the connector module 102 in the recess 150. The backing plate 200 includes a side support surface 210 that defines a rear blocking surface for the connector module 102. The inner edge 208 is configured to be positioned rearward of the second cavity 153. When the connector body 126 is loaded into the recess 150, the backing plate 200 may be positioned rearward of the connector body 126, such as rearward of the second lip 147 to restrict or block removal of the connector module 102 from the recess 150. The backing plate 200 is used to contain the connector module 102 in the mounting frame 104 such that the connector module 102 and the mounting frame 104 may be mounted to the support wall 110 as a unit. The connector module 102 may be held in the mounting frame 104 using the backing plate 200 without the need for the support wall 110 to hold the connector module 102 in the mounting frame 104.

In an exemplary embodiment, the forward section 140 and the rear section 142 of the connector body 126 are coupled together using the fasteners 143. The forward section 140 includes a plurality of contact cavities 172, and the rear section 142 includes a plurality of contact cavities 182. When the forward and rear sections 140, 142 are coupled to each other, the contact cavities 172 of the forward section 140 and the contact cavities 182 of the rear section 142 align with each other to form contact channels 184 (shown in FIG. 5). Each of the contact channels 184 is configured to receive a portion of a corresponding coaxial cable assembly 128 and, in particular, a corresponding coaxial contact 132. Optionally, the contact cavities 182 may open to an outer edge to define open-sided slots sized and shaped to receive the cables 131 of the coaxial cable assemblies 128. The contact cavities 182 may include ledges 186, such as at the rear of the rear section 142, that are used to support the springs of the cable assemblies 128.

In the illustrated embodiment, the forward section 140 includes alignment channels 174 that extend entirely through the forward section 140. The alignment channels 174 are configured to receive alignment posts 176 that are configured to clear the front side 127 and the passage 120 and project away from the mounting frame 104 in the mating direction. The alignment posts 176 are configured to engage the connector module 302 (FIG. 4) during the mating operation. In the illustrated embodiment, the connector assembly 100 includes two alignment posts 176. In other embodiments, however, the connector assembly 100 may include only one alignment post 176 or more than two alignment posts 176.

Figure 4:
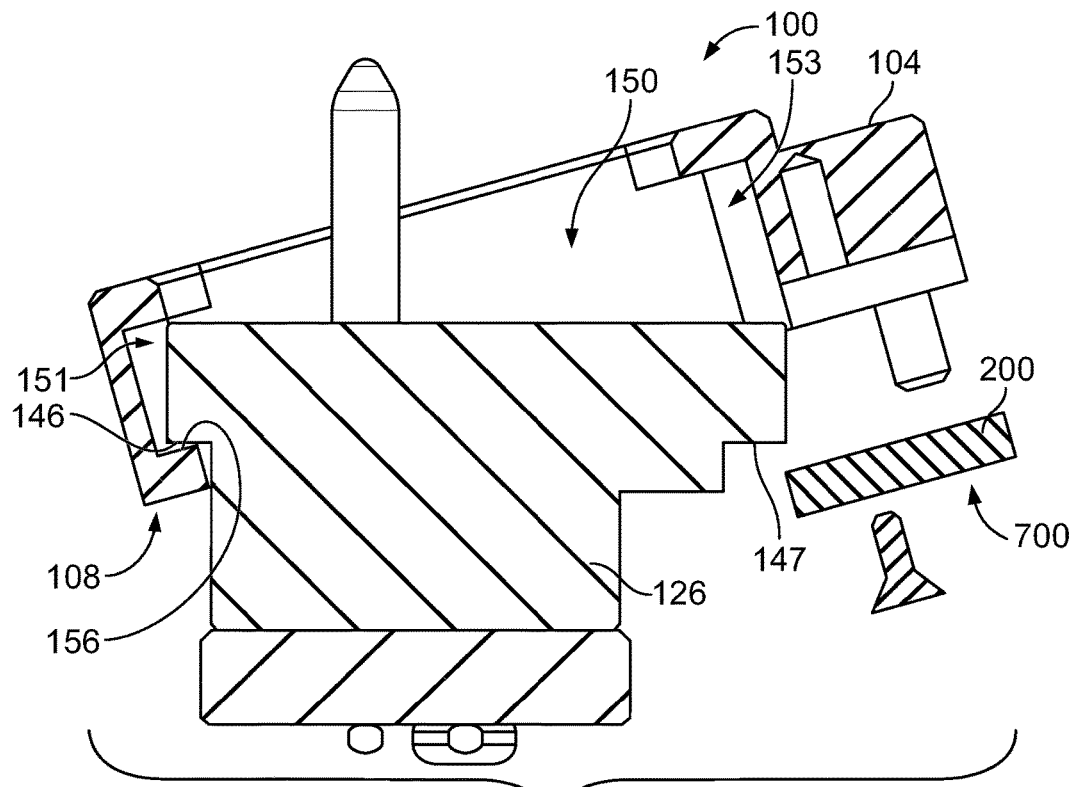
FIG. 4 is a partial sectional view of the coaxial connector assembly being assembled.

FIG. 4 is a partial sectional view of the coaxial connector assembly 100 being assembled. In an exemplary embodiment, the connector body 126 is rotated into the recess 150. For example, the first lip 146 may be loaded into the first cavity 151 and then the connector body 126 may be rotated into the recess 150. For example, the second lip 147 may be rotated into the second cavity 153. The rear rim 156 supports the first lip 146 at the mounting side 108. The second lip 147 may form a slot 164 in a side edge 166 of the connector body 126 that receives the side support 700 (e.g., receives the backing plate 200). Once the connector body 126 is loaded into the recess 150, the backing plate 200 may be secured to the mounting frame 104 and received in the slot 164 to hold the second lip 147 in the second cavity 153.

Figure 5:
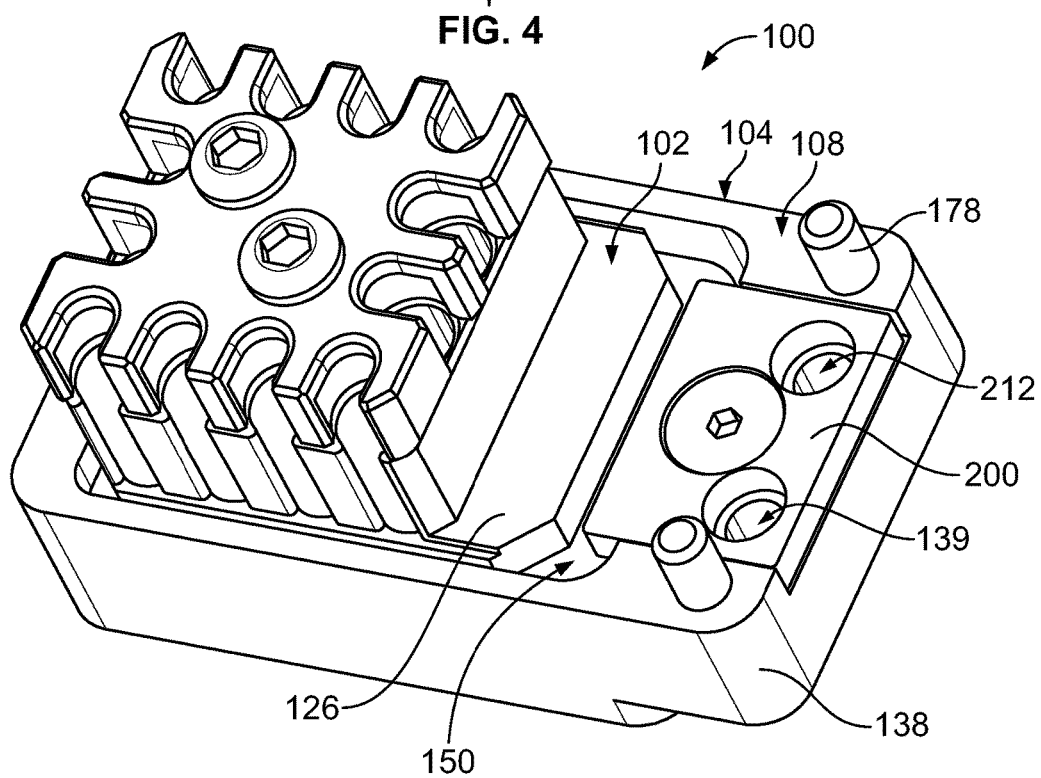
FIG. 5 is a rear perspective view of the coaxial connector assembly in an assembled state.

FIG. 5 is a rear perspective view of the connector assembly 100 in an assembled state. FIG. 5 shows the connector module 102 loaded in the recess 150 of the mounting frame 104. The backing plate 200 holds the connector body 126 in the recess 150. In an exemplary embodiment, the mounting frame 104 includes posts 178 along the frame extension 138 that extend from the mounting side 108. The posts 178 are configured to be received in corresponding openings in the support wall 110 to orient the mounting frame 104 relative to the support wall 110.

In an exemplary embodiment, the backing plate 200 includes one or more through holes 212 configured to be aligned with the through holes 139 in the frame extension 138 of the mounting frame 104. The through holes 212 are sized and shaped to receive hardware (e.g., screws, bolts, plugs, and the like) for securing the mounting frame 104 to the support wall 110.

Figure 6:
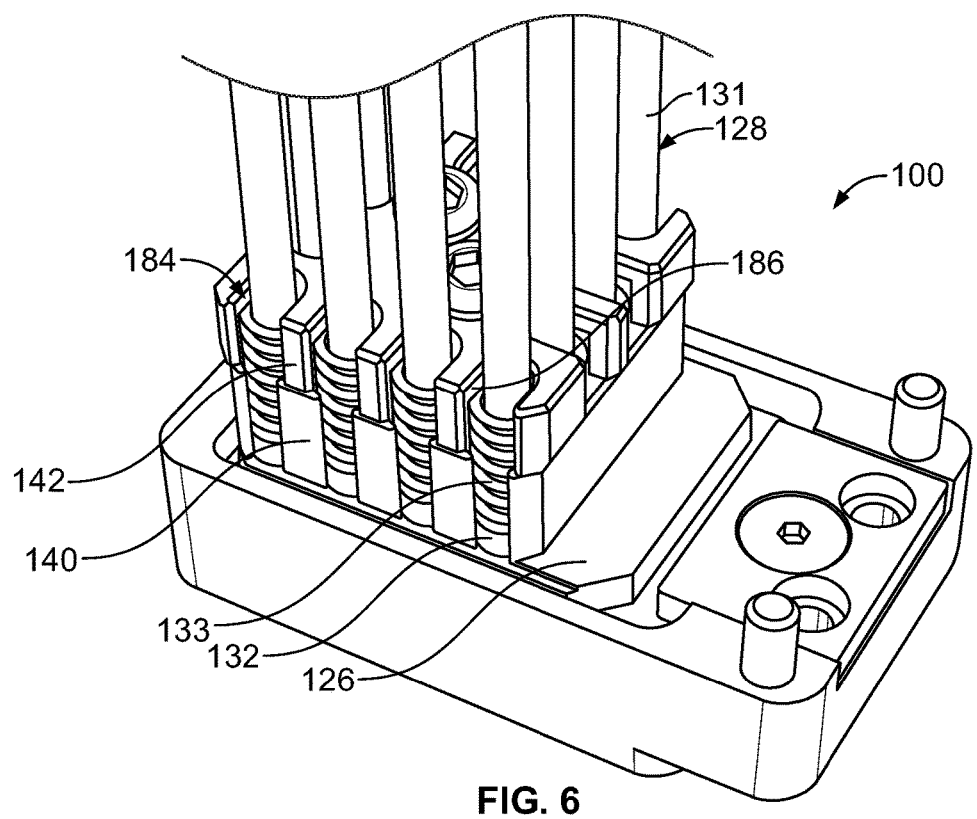
FIG. 6 is a rear perspective view of the coaxial connector assembly in an assembled state.

FIG. 6 is a rear perspective view of the connector assembly 100 in an assembled state. FIG. 6 shows the coaxial cable assemblies 128 coupled to the connector body 126. The coaxial contacts 132 are received in the contact channels 184 of the front section 140. The cables 131 extend rearward from the rear section 142. In an exemplary embodiment, the coaxial cable assemblies 128 include biasing springs 133 coupled to the connector body 126 to allow floating movement of the coaxial contacts 132 in the contact channels 184. The biasing springs 133 are received in corresponding contact channels 184. The biasing springs 133 may engage the coaxial contacts 132 and may engage the ledges 186 at the rear of the rear section 142. When the connector assembly 100 is mated with the connector assembly 300, the coaxial contacts 132 may be compressed and pushed rearward. The biasing springs 133 may allow the coaxial contacts 132 to move axially rearward. The biasing springs 133 provided biasing force for mating the coaxial contacts 132 with the coaxial contacts 324 of the connector assembly 300.

Figure 7:
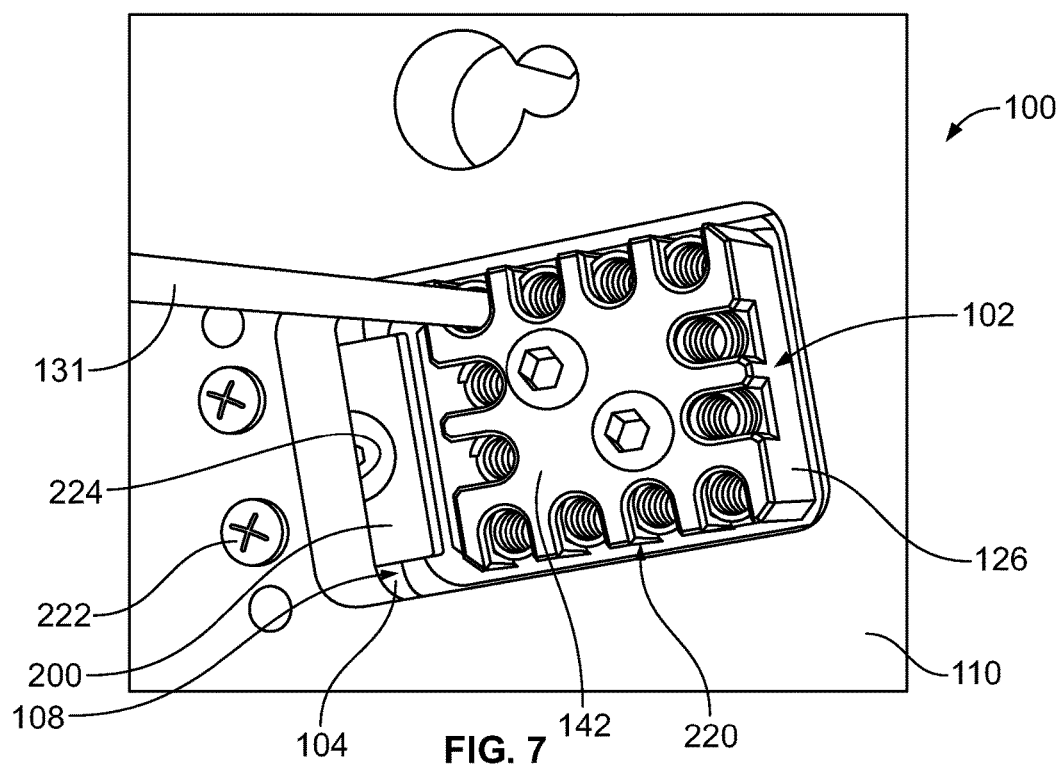
FIG. 7 is a rear perspective view of a portion of the communication system showing the coaxial connector assembly coupled to a support wall.

FIG. 7 is a rear perspective view of a portion of the communication system 10 showing the coaxial connector assembly 100 coupled to the support wall 110. The support wall 110 includes an opening 220. The coaxial connector assembly 100 is coupled to the support wall 110 at the opening 220. The mounting frame 104 is securely coupled to the support wall 110 using fasteners 222 or other means. The mounting side 108 abuts against a front surface 224 of the support wall 110. The mounting frame 104 supports the connector module 102 independent of the support wall 110. For example, the backing plate 200 holds the connector body 126 in the mounting frame 104 such that no portion of the connector body 126 engages the support wall 110. The opening 220 may be oversized relative to the connector module 102. The connector module 102 has a limited amount of floating movement relative to the support wall 110. In an exemplary embodiment, a portion of the connector module 102 extends into and/or through the opening 220. For example, the rear section 142 may extend into and/or through the opening 220. The cables 131 extend through the opening 220 and extend from the support wall 110, such as to another component.

Figure 8:
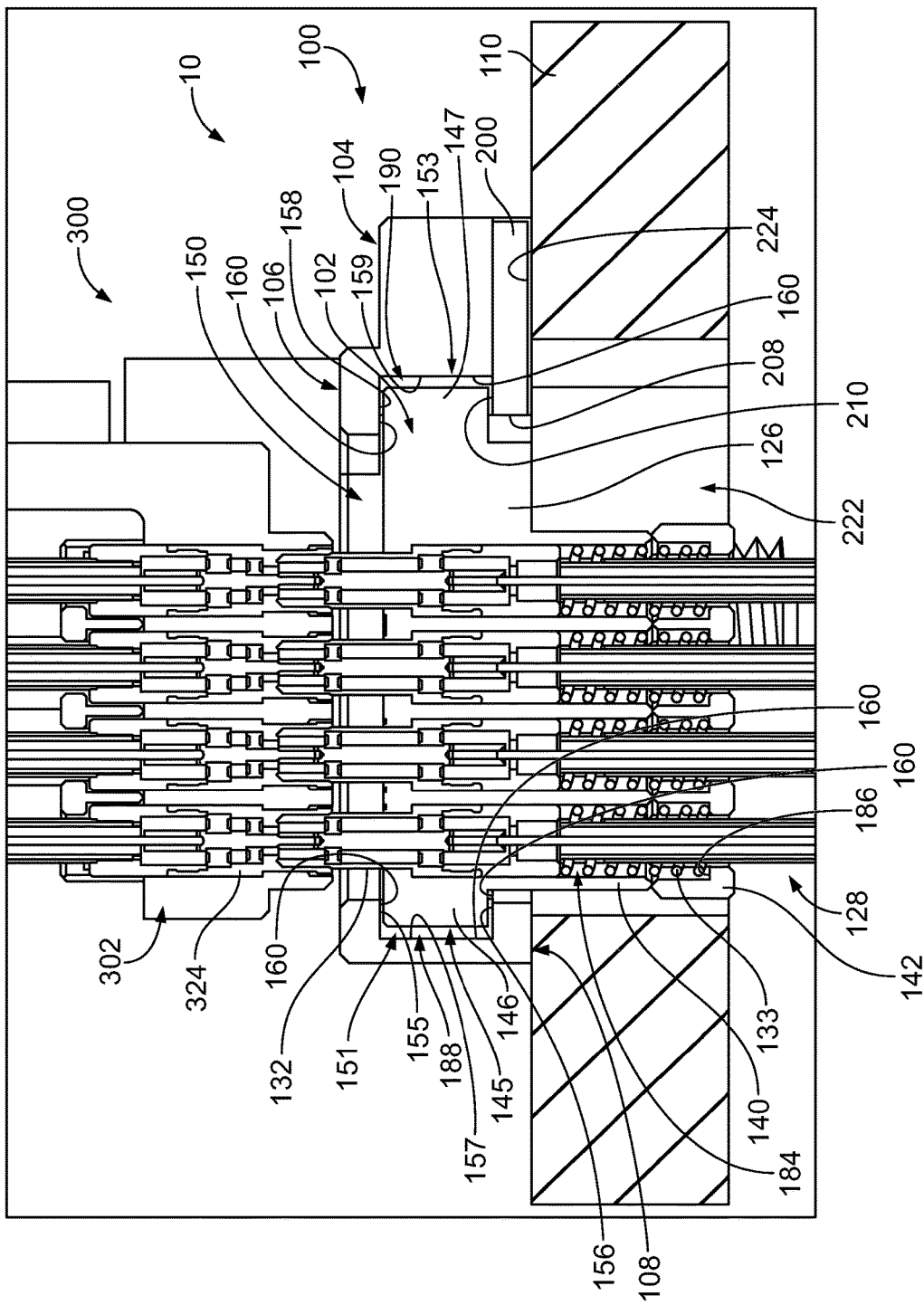
FIG. 8 is a cross-sectional view of the communication system showing the coaxial connector assemblies mated together.

FIG. 8 is a cross-sectional view of the communication system 10 showing the connector assembly 100 mated with the connector assembly 300 at the mating side 106. The connector assembly 100 is mounted to the support wall 110 at the mounting side 108. The rear portion of the front section 140 and the rear section 142 extend into the opening 220. The mounting frame 104 rests on the front surface 224 of the support wall 110. The backing plate 200 holds the connector body 126 in the recess 150. For example, the second lip 147 is received in the second cavity 153 between the front rim 158 and the inner edge 208 of the backing plate 200. The first lip 146 is received in the first cavity 151 between the front rim 155 and the rear rim 156. The connector body 126 is supported by the mounting frame 104 and the backing plate 200 independent of the support wall 110. No portion of the support wall 110 is used to hold the connector body 126 in the recess 150.

In an exemplary embodiment, the connector module 102 has a limited amount of floating movement relative to the mounting frame 104. For example, the recess 150 is oversized relative to the connector body 126. For example, a gap 188 is provided between the connector body 126 and the cavity wall 157 and/or a gap 190 is provided between the connector body 126 in the cavity wall 159. The connector body 126 is able to shift laterally in the recess 150, such as into the gap 188 or into the gap 190.

The mounting frame 104 and the backing plate 200 form a confined space for the connector body 126 to generally hold the connector body 126 while allowing the floating movement within the confined space, such as in one or more directions. The blocking surfaces 160, 210 define the confined space. The confined space represents the limited space in which the portion of the connector module 102 is permitted to move relative to the support wall 110 or the mounting frame 104. In an exemplary embodiment, the flange portion 145 is disposed within the recess 150, such as approximately centrally located such that the flange portion 145 may float in any direction along the lateral plane. For instance, the flange portion 145 is permitted to move a shift distance along the first lateral axis 192 in a first direction or a shift distance along the first lateral axis 192 in the opposite direction. The flange portion 145 may also be permitted to move shift distances in either direction along the second lateral axis 193.

During lifetime operation of the connector assembly 100, however, the connector assembly 100 may have a different position within the recess 150 prior to mating with the connector module 302 than the position shown in FIG. 8. For example, gravity may cause the flange portion 145 to engage or be located closer to one of the blocking surfaces 160 than other areas. As such, the shift distances may vary depending upon the dimensions of the blocking surfaces 160, the flange portion 145, gravity, and/or other factors.

In some embodiments, the recess 150 may be sized to allow the flange portion 145 and, consequently, the connector module 102 to rotate. For example, the connector module 102 may be permitted to roll, pitch, or yaw. Such embodiments may facilitate aligning and mating corresponding coaxial contacts without stubbing or other damage to the connector assemblies.

The coaxial cable assemblies 128 include the biasing springs 133 coupled to the connector body 126 to allow floating movement of the coaxial contacts 132 in the contact channels 184. The biasing springs 133 engage the coaxial contacts 132 and engage the ledges 186 at the rear of the rear section 142. When the connector assembly 100 is mated with the connector assembly 300, the coaxial contacts 132 are pushed rearward to compress the biasing springs 133. The biasing springs 133 allow the coaxial contacts 132 to move axially rearward and provide a biasing force for mating the coaxial contacts 132 with the mating contacts 324 of the connector assembly 300. The biasing force facilitates maintaining a sufficient electrical connection between the coaxial contacts 132 and the coaxial contacts 324. For example, in some environments, the communication system 10 may experience shock, vibration, and/or extreme temperatures that may cause deformation, movement, and/or creepage among different elements. The biasing force may lengthen or improve the lifetime operability of the communication system 10.

Figure 9:
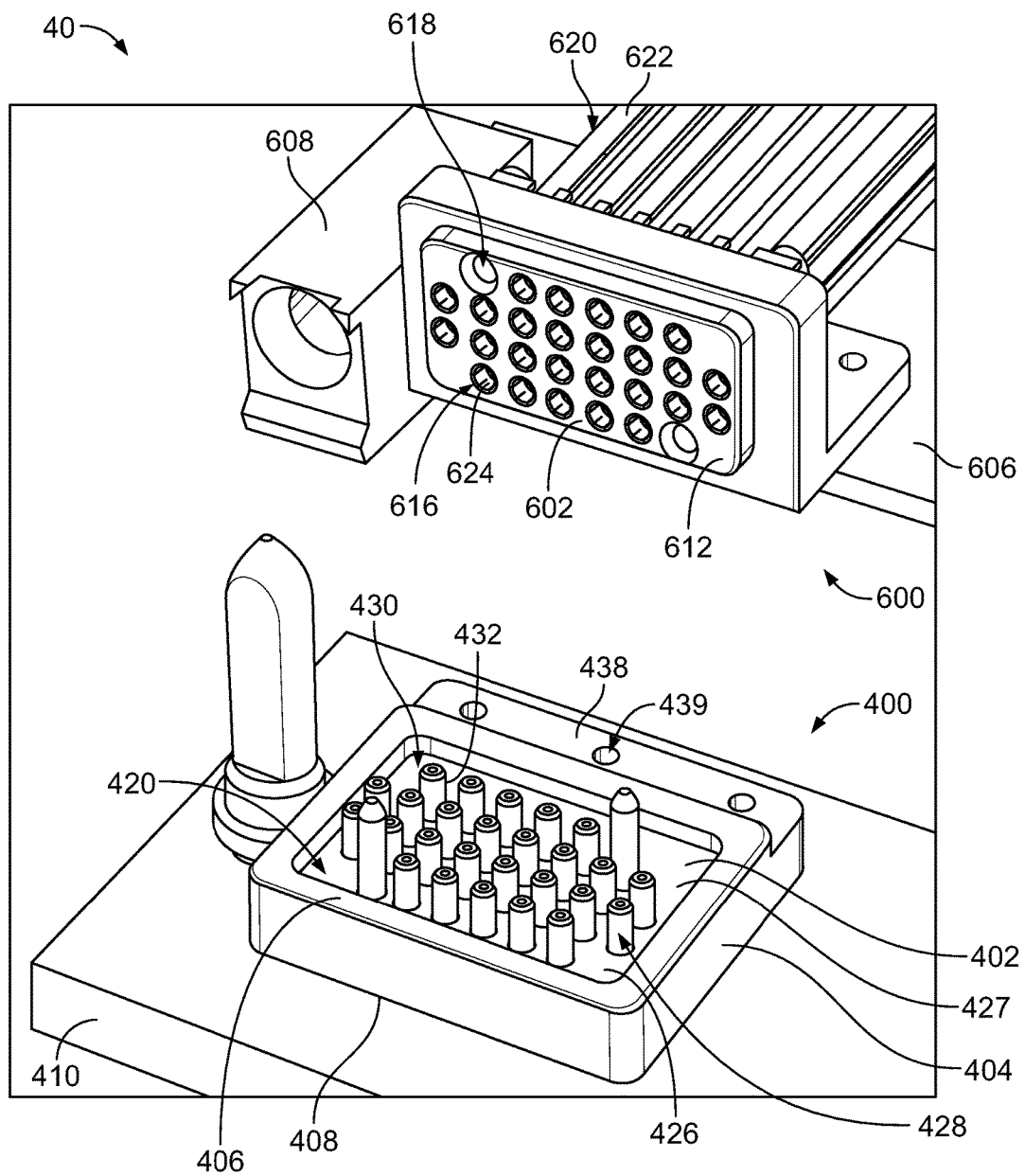
FIG. 9 is a perspective view of a communication system formed in accordance with an exemplary embodiment showing coaxial connector assemblies in an unmated state.

FIG. 9 is a perspective view of a communication system 40 formed in accordance with an exemplary embodiment, showing a coaxial connector assembly 400 and a coaxial connector assembly 600 in an unmated state. The coaxial connector assemblies 400, 600 are configured to be mated along a mating axis. The coaxial connector assemblies 400, 600 are similar to the coaxial connector assemblies 100, 300, respectively, shown in FIG. 1; however, the coaxial connector assemblies 400, 600 have a greater number of contacts.

The coaxial connector assemblies 400, 600 have features and arrangements to accommodate the greater number of contacts.

In an exemplary embodiment, the coaxial connector assembly 600 includes a connector module 602 and a substrate 606. The connector module 602 is mounted to the substrate 606. The substrate 606 may be a circuit card, such as a daughter card. The coaxial connector assembly 600 includes a guide module 608 mounted to the substrate 606 proximate to the connector module 602. The connector module 602 includes a connector body 610 having a plurality of contact channels 616 receiving corresponding coaxial cable assemblies 620. The connector body 612 includes alignment features 618 for aligning the connector module 602 with the coaxial connector assembly 400 during mating. Each coaxial cable assembly 620 includes a cable 622 and a coaxial contact 624.

The connector assembly 400 includes a connector module 402 and a mounting frame 404 that are operably coupled to each other. The connector module 402 is mounted to a support wall 410. The support wall 410 may be, for example, a circuit board (for example, a backplane circuit board), a panel, or another type of wall. The mounting frame 404 is used to secure the connector module 402 to the support wall 410. In an exemplary embodiment, the mounting frame 404 is slightly oversized relative to the connector module 402 such that the connector module 402 has a limited amount of floating movement relative to the mounting frame 404, such as for alignment with the coaxial connector assembly 600 during mating. For example, the connector module 402 is permitted to move in a lateral direction during a mating operation (for example, parallel to the plane of the support wall 410).

The mounting frame 404 includes opposite mating and mounting sides 406, 408. The mounting frame 404 includes a passage 420 that extends through the mating and mounting sides 406, 408. The passage 420 is sized and shaped to receive a portion of the connector module 402. The mounting frame 404 may include a frame extension 438 configured to interface with the support wall 410. The frame extension 438 includes one or more through holes 439 that are sized and shaped to receive hardware (e.g., screws, bolts, plugs, and the like) for securing the mounting frame 404 to the support wall 410.

The connector module 402 includes a connector body 426 having a front side 427 and a rear side 429 that face in the mating direction and the mounting direction, respectively. The connector module 402 also includes a contact array 430 of coaxial contacts 432 that are coupled to the connector body 426. The connector body 426 holds the coaxial contacts 432 at designated positions for engaging corresponding coaxial contacts 624. In the illustrated embodiment, the coaxial contacts 432 are elements of corresponding coaxial cable assemblies 428.

Figure 10:
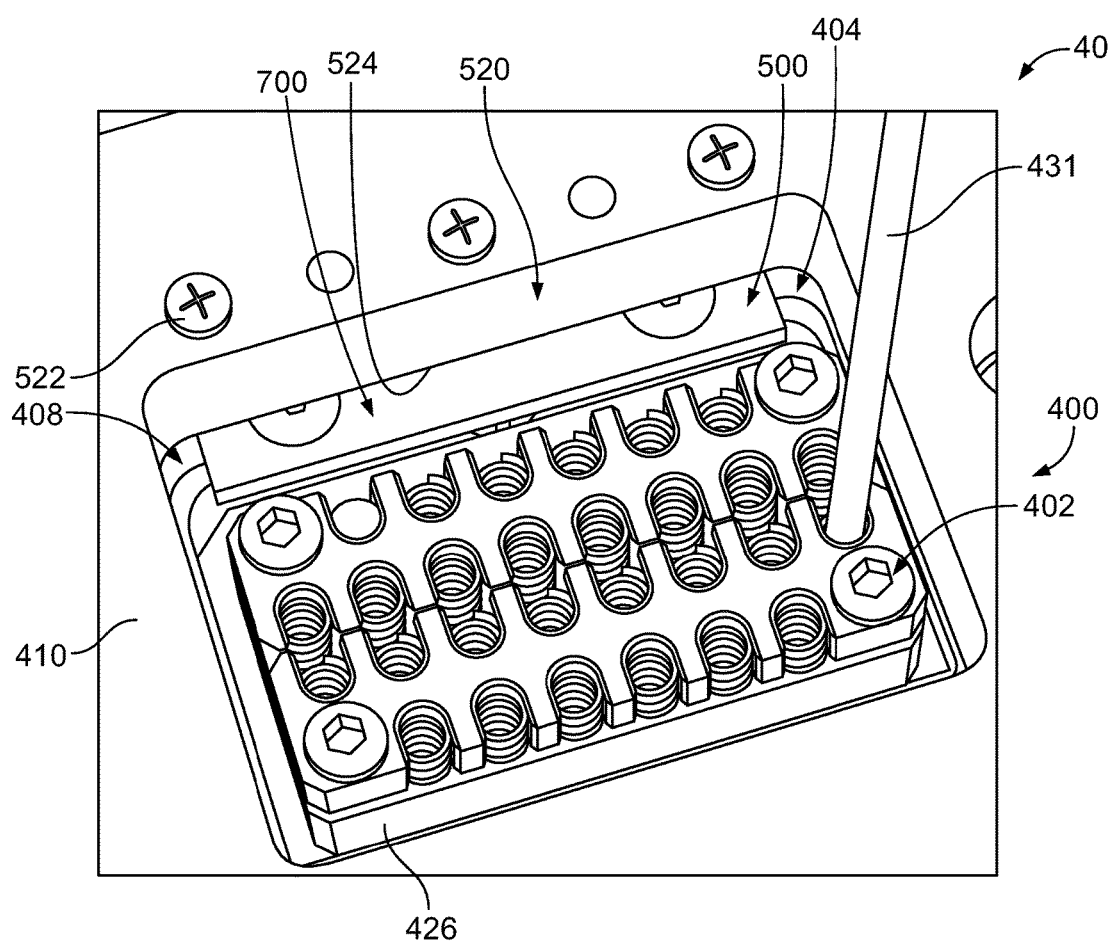
FIG. 10 is a rear perspective view of a portion of the communication system showing the coaxial connector assembly coupled to a support wall.

FIG. 10 is a rear perspective view of a portion of the communication system 40 showing the coaxial connector assembly 400 coupled to the support wall 410. The support wall 410 includes an opening 520. The coaxial connector assembly 400 is coupled to the support wall 410 at the opening 520. The mounting frame 404 is securely coupled to the support wall 410 using fasteners 522 or other means. The mounting side 408 abuts against a front surface 524 of the support wall 410. The mounting frame 404 supports the connector module 402 independent of the support wall 410. For example, the side support 700 is used to secure the connector module 402 in the mounting frame 404. In the illustrated embodiment, the side support 700 is a backing plate 500 that holds the connector body 426 in the mounting frame 404 such that no portion of the connector body 426 engages the support wall 410. The opening 520 may be oversized relative to the connector module 402. The connector module 402 has a limited amount of floating movement relative to the support wall 410. In an exemplary embodiment, a portion of the connector module 402 extends into and/or through the opening 520. The cables 431 extend through the opening 520 and extend from the support wall 410, such as to another component.

Figure 11:
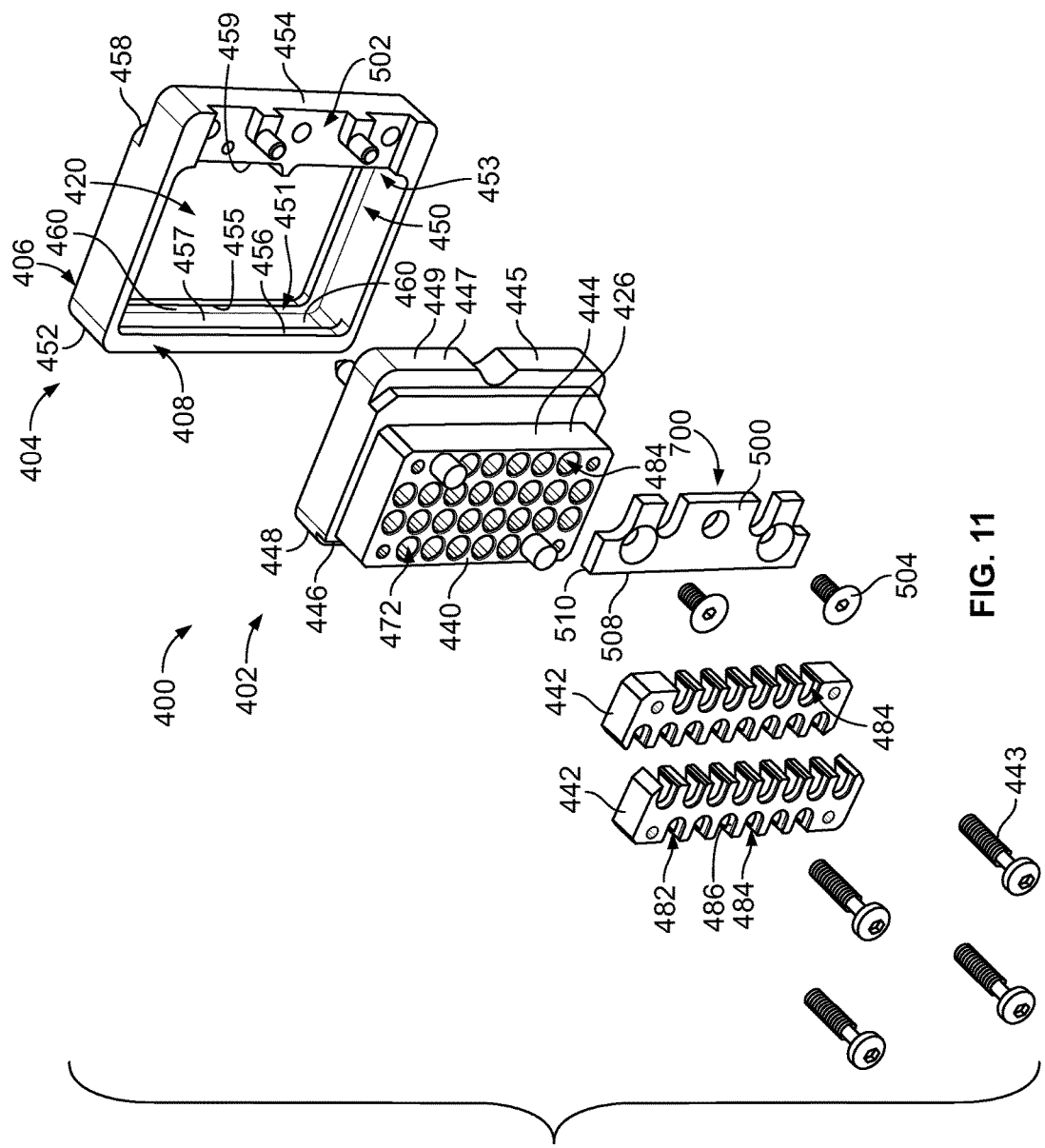
FIG. 11 is an exploded view of the coaxial connector assembly.

FIG. 11 is an exploded view of the connector assembly 400. The connector body 426 includes a forward section 440 and a rear section 442. The forward and rear sections 440, 442 are discrete elements that are configured to be secured to each other. In the illustrated embodiment, the forward and rear sections 440, 442 are secured to each other using hardware 443 (e.g., screws), but may be secured to each other in other manners in alternative embodiments. In various embodiments, the hardware 443 are captive screws configured to be held in the rear section 442, such as to make assembly easier and/or to prevent losing the hardware 443 during assembly. The forward section 440 includes a main portion 444 and a flange portion 445 that extends laterally (or radially) away from the main portion 444. The flange portion 445 may be defined by a first lip 446 and a second lip 447 at opposite first and second sides 448, 449. The flange portion 445 may include other lips in alternative embodiments, such as a lip along the top and/or the bottom. The lips 446, 447 may include rearward-facing surfaces facing in the mounting direction.

The mounting frame 404 includes a connector-receiving recess 450 of the passage 420 that opens along the mounting side 408 to receive the connector body 426. The recess 450 includes a first cavity 451 at a first side wall 452 of the mounting frame 404 and a second cavity 453 at a second side wall 454 of the mounting frame 404. The connector-receiving recess 450 is sized and shaped to receive the main portion 444 of the connector body 426 and the cavities 451, 453 are sized and shaped to receive the flange portion 445, such as the first lip 446 and the second lip 447, respectively. In an exemplary embodiment, the first cavity 451 is defined by a front rim 455 at the mating side 406 and a rear rim 456 at the mounting side 408. The first cavity 451 includes a cavity wall 457 between the front rim 455 and the rear rim 456 at the first end of the recess 450. The first cavity 451 is open at the first side of the recess 450 and is closed or blocked by the front rim 455, the rear rim 456 in the cavity wall 457. In an exemplary embodiment, the second cavity 453 is defined by a front rim 458 at the mating side 406 and a cavity wall 459 opposite the cavity wall 457. The second cavity 453 is open at the mounting side 408, such as for loading the connector body 426 into the recess 450.

The connector-receiving recess 450 is defined by blocking surfaces 460 used to block or retain the connector module 402 and the mounting frame 404. The blocking surfaces 460 may limit or restrict movement of the connector module 402 in an axial direction along the mating axis. The blocking surfaces 460 may limit or restrict movement of the connector module 402 in a lateral direction. In an exemplary embodiment, the blocking surfaces 460 are defined by the front rim 455, the rear rim 456, the cavity wall 457, the front rim 458 and the cavity wall 459. The mounting frame 404 may include additional blocking surfaces 460 in alternative embodiments, such as blocking surfaces 460 defined by the top and the bottom of the recess 450. The first lip 446 of the flange portion 445 is configured to be retained or trapped between the front and rear rims 455, 456 of the mounting frame 404. The blocking surfaces 460 may limit axial movement.

The connector assembly 400 includes the side support 700 (e.g., the backing plate 500) configured to be coupled to the mounting frame 404. The backing plate 500 is used to secure the connector module 402 in the recess 450. In an exemplary embodiment, the mounting frame 404 includes a slot 502 at the mounting side 408, such as at the second side wall 454. The slot 502 is sized and shaped to receive the backing plate 500. The slot 502 may be a pocket that is open at the mounting side 408. In other various embodiments, the slot 502 may be closed at the mounting side 408 and open at the outer edge of the side wall 454 to receive the backing plate 500 (e.g., being side loaded into the slot). In an exemplary embodiment, the backing plate 500 may be secured to the mounting frame 404, such as using a fastener 504. In an exemplary embodiment, an inner edge of the backing plate 500 defines a side support surface 508 that extends into the recess 450 to overlap and retain the connector module 402 in the recess 450. The side support surface 508 defines a blocking surface 510 for the connector module 402. The side support surface 508 is configured to be positioned rearward of the second cavity 453. When the connector body 426 is loaded into the recess 450, the backing plate 500 may be positioned rearward of the connector body 426 in the slot formed by the second lip 447, such as rearward of the second lip 447, to restrict or block removal of the connector module 402 from the recess 450. The backing plate 500 is used to contain the connector module 402 in the mounting frame 404 such that the connector module 402 and the mounting frame 404 may be mounted to the support wall 410 as a unit. The connector module 402 may be held in the mounting frame 404 using the backing plate 500 without the need for the support wall 410 to hold the connector module 402 in the mounting frame 404.

During assembly, the connector body 426 is rotated into the recess 450. For example, the first lip 446 may be loaded into the first cavity 451 and then the connector body 426 may be rotated into the recess 450. For example, the second lip 447 may be rotated into the second cavity 453. The rear rim 456 supports the first lip 446 at the mounting side 408. Once the connector body 426 is loaded into the recess 450, the backing plate 500 may be secured to the mounting frame 404 to hold the second lip 447 in the second cavity 453.

In an exemplary embodiment, the forward section 440 and the rear section 442 of the connector body 426 are coupled together using fasteners 470. The forward section 440 includes a plurality of contact cavities 472, and the rear section 442 includes a plurality of contact cavities 482. When the forward and rear sections 440, 442 are coupled to each other, the contact cavities 472 of the forward section 440 and the contact cavities 482 of the rear section 442 align with each other to form contact channels 484 (shown in FIG. 5). Each of the contact channels 484 is configured to receive a portion of a corresponding coaxial cable assembly 428 and, in particular, a corresponding coaxial contact 432. Optionally, the contact cavities 482 may open to an outer edge to define open-sided slots sized and shaped to receive the cables 431 of the coaxial cable assemblies 428. The contact cavities 482 may include ledges 486, such as at the rear of the rear section 442, that are used to support the springs of the cable assemblies 428.

Figure 12:
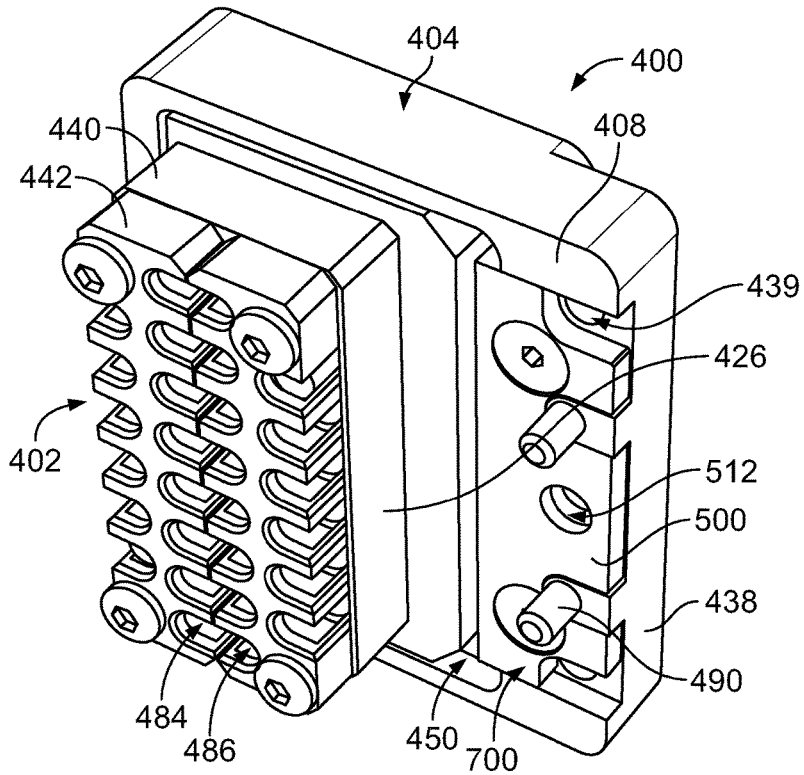
FIG. 12 is a rear perspective view of the coaxial connector assembly in an assembled state.
Figure 13:
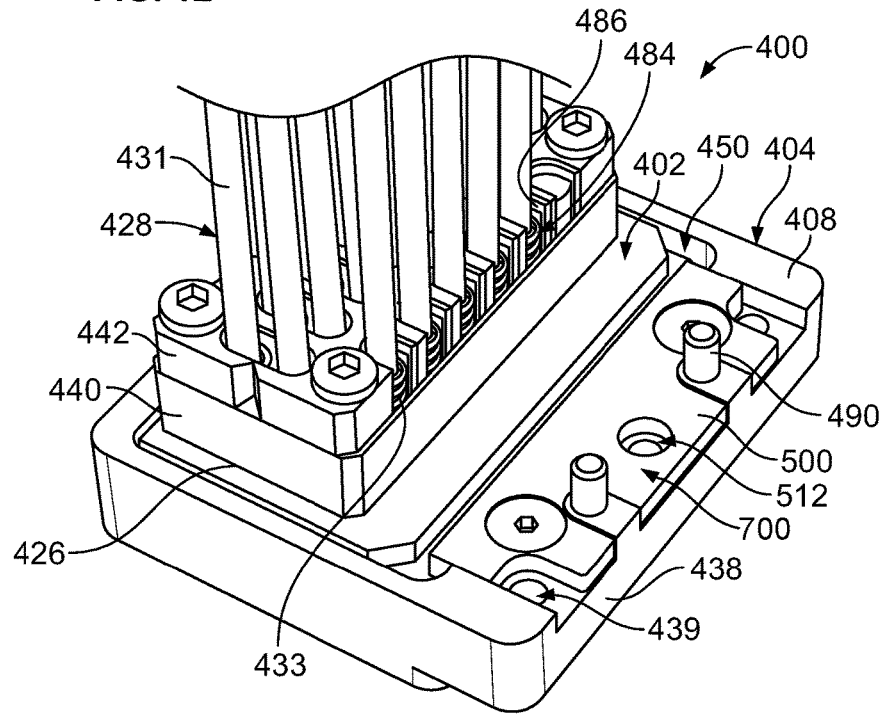
FIG. 13 is another rear perspective view of the coaxial connector assembly in an assembled state.

FIG. 12 is a rear perspective view of the connector assembly 400 in an assembled state. FIG. 13 is another rear perspective view of the connector assembly 400 in an assembled state showing the coaxial cable assemblies 428 coupled to the connector body 426. FIGS. 12 and 13 show the connector module 402 loaded in the recess 450 of the mounting frame 404. The side support 700 (e.g., the backing plate 500) holds the connector body 426 in the recess 450. In an exemplary embodiment, the mounting frame 404 includes posts 490 along the frame extension 438 that extend from the mounting side 408. The post 490 are configured to be received in corresponding openings in the support wall 410 to orient the mounting frame 404 relative to the support wall 410.

In an exemplary embodiment, the backing plate 500 includes one or more through holes 512 configured to be aligned with the through holes 439 in the frame extension 438 of the mounting frame 404. The through holes 512 are sized and shaped to receive hardware (e.g., screws, bolts, plugs, and the like) for securing the mounting frame 404 to the support wall 410.

The coaxial contacts 432 are received in the contact channels 484 of the front section 440. The cables 431 extend rearward from the rear section 442. In an exemplary embodiment, the coaxial cable assemblies 428 include biasing springs 433 coupled to the connector body 426 to allow floating movement of the coaxial contacts 432 in the contact channels 484. The biasing springs 433 are received in corresponding contact channels 484. The biasing springs 433 may engage the coaxial contacts 432 and may engage the ledges 486 at the rear of the rear section 442. When the connector assembly 400 is mated with the connector assembly 600, the coaxial contacts 432 may be compressed and pushed rearward. The biasing springs 433 may allow the coaxial contacts 432 to move axially rearward. The biasing springs 433 provided biasing force for mating the coaxial contacts 432 with the coaxial contacts 624 of the connector assembly 600.

Figure 14:
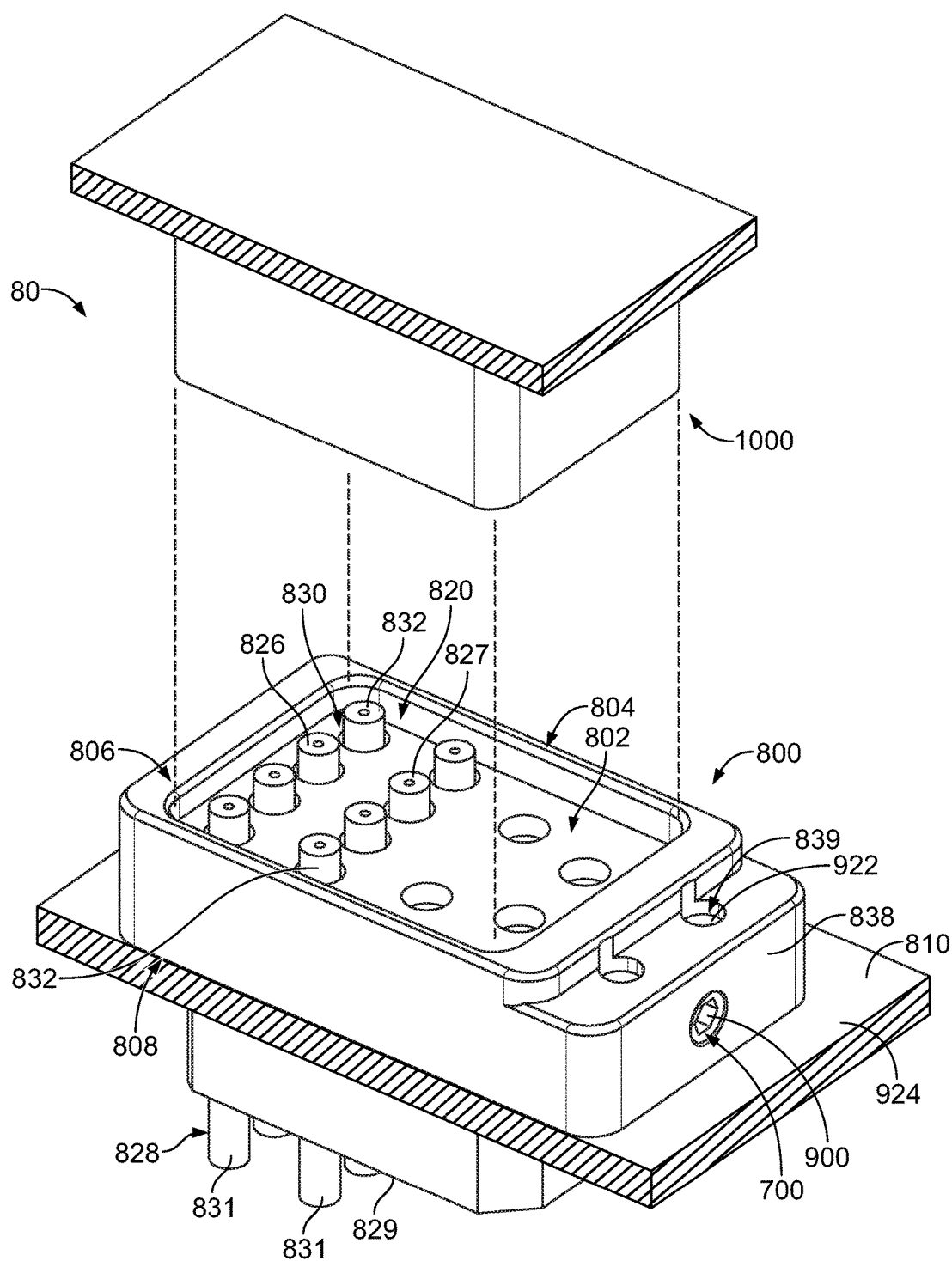
FIG. 14 is a perspective view of a communication system formed in accordance with an exemplary embodiment showing coaxial connector assemblies in an unmated state.

FIG. 14 is a perspective view of a communication system 80 formed in accordance with an exemplary embodiment, showing a coaxial connector assembly 800 and a coaxial connector assembly 1000 in an unmated state. The coaxial connector assemblies 800, 1000 are configured to be mated along a mating axis. The coaxial connector assembly 1000 is similar to the coaxial connector assembly 300 shown in FIG. 1.

The connector assembly 800 includes a connector module 802 and a mounting frame 804 that are operably coupled to each other. The connector module 802 is mounted to a support wall 810. The support wall 810 may be, for example, a circuit board (for example, a backplane circuit board), a panel, or another type of wall. The mounting frame 804 is used to secure the connector module 802 to the support wall 810. In an exemplary embodiment, the mounting frame 804 is slightly oversized relative to the connector module 802 such that the connector module 802 has a limited amount of floating movement relative to the mounting frame 804, such as for alignment with the coaxial connector assembly 1000 during mating. For example, the connector module 802 is permitted to move in a lateral direction during a mating operation (for example, parallel to the plane of the support wall 810). The connector assembly 800 includes the side support 700 for supporting the connector module 802 in the mounting frame 804. In the illustrated embodiment, the side support 700 is a support pin 900 loaded through a side of the mounting frame 804.

The mounting frame 804 includes opposite mating and mounting sides 806, 808. The mounting frame 804 includes a passage 820 that extends through the mating and mounting sides 806, 808. The passage 820 is sized and shaped to receive a portion of the connector module 802. The mounting frame 804 may include a frame extension 838 configured to interface with the support wall 810. The frame extension 838 includes one or more through holes 839 that are sized and shaped to receive hardware (e.g., screws, bolts, plugs, and the like) for securing the mounting frame 804 to the support wall 810.

The connector module 802 includes a connector body 826 having a front side 827 and a rear side 829 that face in the mating direction and the mounting direction, respectively. The connector module 802 also includes a contact array 830 of coaxial contacts 832 that are coupled to the connector body 826. The connector body 826 holds the coaxial contacts 832 at designated positions for engaging corresponding coaxial contacts (not shown) of the coaxial connector assembly 1000. In the illustrated embodiment, the coaxial contacts 832 are elements of corresponding coaxial cable assemblies 828 terminated to ends of cables 831.

The mounting frame 804 is securely coupled to the support wall 810 using fasteners 922 or other means. The mounting side 808 abuts against a front surface 924 of the support wall 810. The mounting frame 804 supports the connector module 802 independent of the support wall 810. For example, the side support 700 is used to secure the connector module 802 in the mounting frame 804. The connector module 802 has a limited amount of floating movement relative to the support wall 810 and the mounting frame 804. For example, the connector module 802 may be movable relative to the support pin 900 while the support pin 900 captures the connector module 802 in the mounting frame 804.

Figure 15:
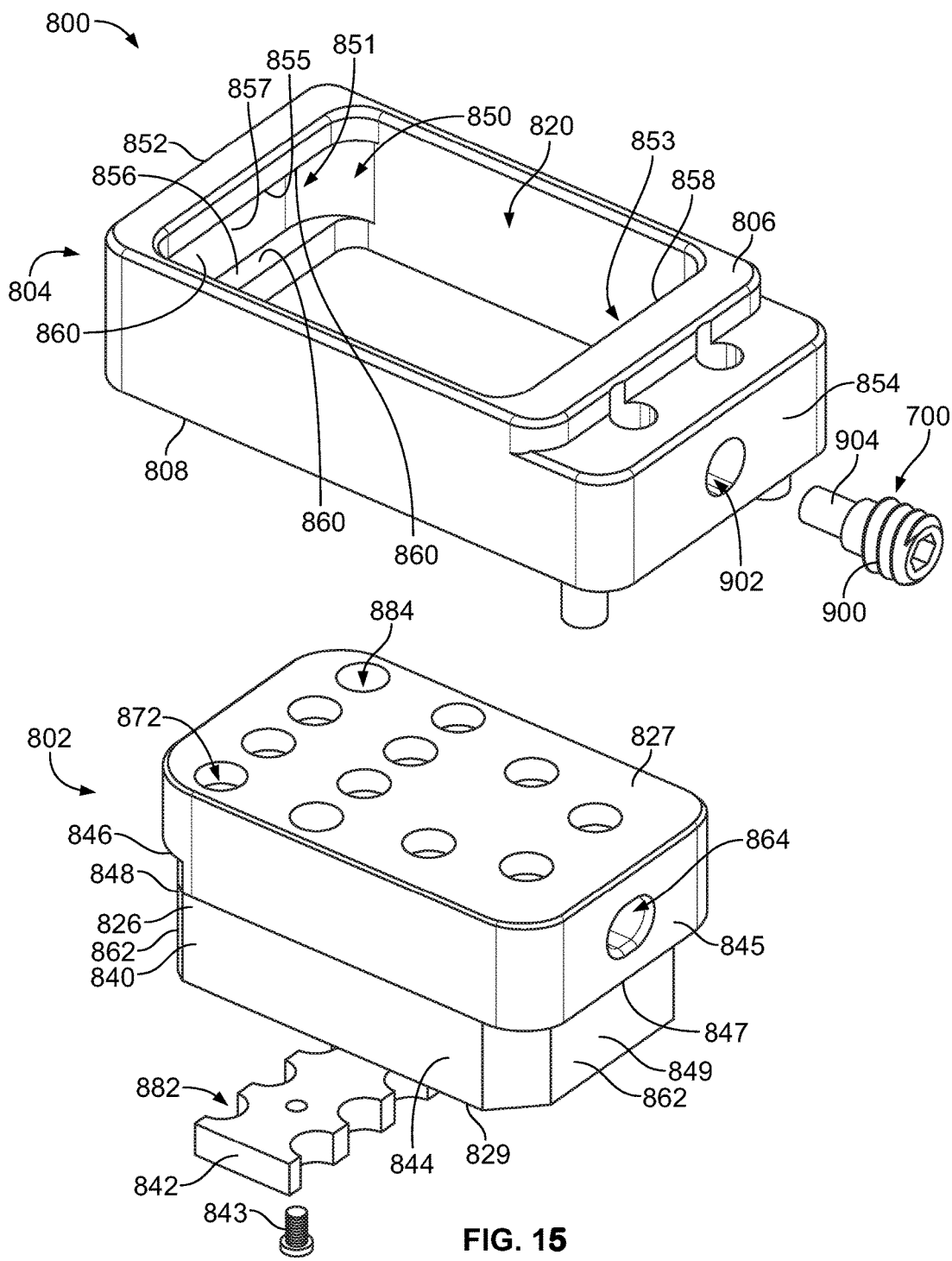
FIG. 15 is an exploded view of a portion of the connector assembly showing the coaxial connector assembly in accordance with an exemplary embodiment.

FIG. 15 is an exploded view of a portion of the connector assembly 800. The connector body 826 includes a forward section 840 and a rear section 842. The forward and rear sections 840, 842 are discrete elements that are configured to be secured to each other. In the illustrated embodiment, the forward and rear sections 840, 842 are secured to each other using hardware 843 (e.g., screws), but may be secured to each other in other manners in alternative embodiments. In various embodiments, the hardware 843 are captive screws configured to be held in the rear section 842, such as to make assembly easier and/or to prevent losing the hardware 843 during assembly. The forward section 840 includes a main portion 844 and a flange portion 845 that extends laterally (or radially) away from the main portion 844. The flange portion 845 may be defined by a first lip 846 and a second lip 847 at opposite first and second sides 848, 849. The flange portion 845 may include other lips in alternative embodiments, such as a lip along the top and/or the bottom. The lips 846, 847 may include rearward-facing surfaces facing in the mounting direction.

The mounting frame 804 includes a connector-receiving recess 850 of the passage 820 that opens along the mounting side 808 to receive the connector body 826. The recess 850 includes a first cavity 851 at a first side wall 852 of the mounting frame 804 and a second cavity 853 at a second side wall 854 of the mounting frame 804. The connector-receiving recess 850 is sized and shaped to receive the main portion 844 of the connector body 826 and the cavities 851, 853 are sized and shaped to receive the flange portion 845, such as the first lip 846 and the second lip 847, respectively. In an exemplary embodiment, the first cavity 851 is defined by a front rim 855 at the mating side 806 and a rear rim 856 at the mounting side 808. The first cavity 851 includes a cavity wall 857 between the front rim 855 and the rear rim 856 at the first end of the recess 850. The first cavity 851 is open at the first side of the recess 850 and is closed or blocked by the front rim 855, the rear rim 856 in the cavity wall 857. In an exemplary embodiment, the second cavity 853 is defined by a front rim 858 at the mating side 806 and a cavity wall 859 (FIG. 16) opposite the cavity wall 857. The second cavity 853 is open at the mounting side 808, such as for loading the connector body 826 into the recess 850.

The connector-receiving recess 850 is defined by blocking surfaces 860 used to block or retain the connector module 802 and the mounting frame 804. The blocking surfaces 860 may limit or restrict movement of the connector module 802 in an axial direction along the mating axis. The blocking surfaces 860 may limit or restrict movement of the connector module 802 in a lateral direction. In an exemplary embodiment, the blocking surfaces 860 are defined by the front rim 855, the rear rim 856, the cavity wall 857, the front rim 858 and the cavity wall 859. The mounting frame 804 may include additional blocking surfaces 860 in alternative embodiments, such as blocking surfaces 860 defined by the top and the bottom of the recess 850. The first lip 846 of the flange portion 845 is configured to be retained or trapped between the front and rear rims 855, 856 of the mounting frame 804. The blocking surfaces 860 may limit axial movement.

The connector body 826 includes side edges 862 between the front side 827 and the rear side 829. The lips 846, 847 are provided at corresponding side edges 862 of the connector body 826. In an exemplary embodiment, one of the side edges 862 includes a slot 864 configured to receive the side support 700 (e.g., receives the support pin 900). The slot 864 is a bore formed in the side edge 862. In an exemplary embodiment, the slot 864 is elongated (e.g., side-to-side) to allow movement of the connector body 826 relative to the support pin 900 when the support pin 900 is received in the slot 864. The slot 864 is sized and shaped to allow lateral movement of the connector body 826. As such, the connector body 826 is able to move laterally within the recess 850 of the mounting frame 804 while still being captured in the recess 850 by the support pin 900.

The connector assembly 800 includes the side support 700 (e.g., the support pin 900) configured to be coupled to the mounting frame 804. The support pin 900 is used to secure the connector module 802 in the recess 850. In an exemplary embodiment, the mounting frame 804 includes a slot 902 at the second side wall 854. The slot 902 is sized and shaped to receive the support pin 900. The slot 902 may be a bore, such as a cylindrical bore, that is open at the second side wall 854. The slot 902 is closed at the mating side 806 and at the mounting side 808 to capture the support pin 900 in the side wall 854. The support pin 900 is side loaded into the slot 902 in a loading direction perpendicular to the mating direction and the mating axis. In an exemplary embodiment, the support pin 900 may be secured to the mounting frame 804, such as by a threaded interface between the support pin 900 and the mounting frame 804. In an exemplary embodiment, the support pin 900 includes a side support surface 904 that extends into the recess 850 and into the connector module 802 to restrict or block removal of the connector module 802 from the recess 850. The support pin 900 is used to contain the connector module 802 in the mounting frame 804 such that the connector module 802 and the mounting frame 804 may be mounted to the support wall 810 as a unit. The connector module 802 may be held in the mounting frame 804 using the support pin 900 without the need for the support wall 810 to hold the connector module 802 in the mounting frame 804.

In an exemplary embodiment, the forward section 840 and the rear section 842 of the connector body 826 are coupled together using the fasteners 843. The forward section 840 includes a plurality of contact cavities 872, and the rear section 842 includes a plurality of contact cavities 882. When the forward and rear sections 840, 842 are coupled to each other, the contact cavities 872 of the forward section 840 and the contact cavities 882 of the rear section 842 align with each other to form contact channels 884. Each of the contact channels 884 is configured to receive a portion of a corresponding coaxial cable assembly 828 (FIG. 14) and, in particular, a corresponding coaxial contact 832 (FIG. 14). Optionally, the contact cavities 882 may open to an outer edge to define open-sided slots sized and shaped to receive the cables 831 (FIG. 14) of the coaxial cable assemblies 828. The contact cavities 882 may include ledges, such as at the front of the rear section 842, that are used to support the springs of the cable assemblies 828.

Figure 16:
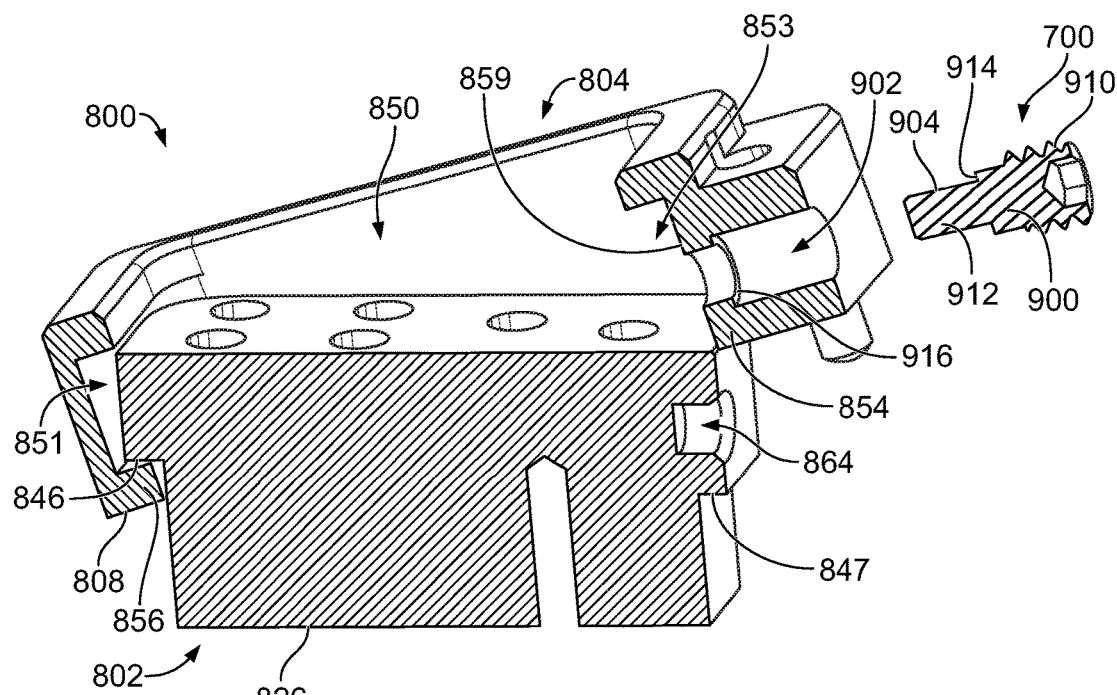
FIG. 16 is a sectional view of the coaxial connector assembly partially assembled in accordance with an exemplary embodiment.
Figure 17:
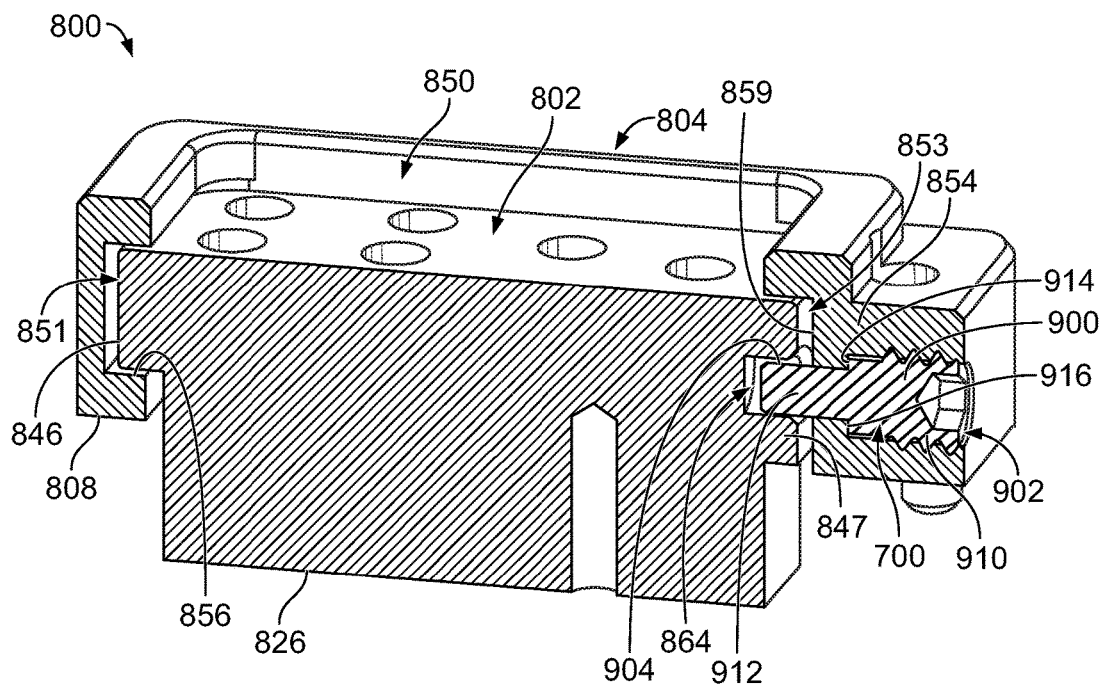
FIG. 17 is a sectional view of the coaxial connector assembly in an assembled state in accordance with an exemplary embodiment.

FIG. 16 is a sectional view of the connector assembly 800 partially assembled. FIG. 17 is a sectional view of the connector assembly 800 in an assembled state. FIG. 16 shows the connector module 802 partially loaded in the recess 850 of the mounting frame 804 and FIG. 17 shows the connector module 802 fully loaded in the recess 850. The side support 700 (e.g., the support pin 900) is coupled to the mounting frame 804 and the connector body 826 after the connector body 826 is loaded in the recess 850 to retain the connector body 826 in the recess 850. For example, the support pin 900 may be loaded through the slot 902 in the mounting frame 804 into the slot 864 in the connector body 826.

During assembly, the connector body 826 is rotated into the recess 850. For example, the first lip 846 may be loaded into the first cavity 851 and then the connector body 826 may be rotated into the recess 850. For example, the second lip 847 may be rotated into the second cavity 853. The rear rim 856 supports the first lip 846 at the mounting side 808. Once the connector body 826 is loaded into the recess 850, the support pin 900 may be secured to the mounting frame 804 to hold the second lip 847 in the second cavity 853. For example, the side support surface 904 supports the connector body 826 in the slot 864. In an exemplary embodiment, the slot 864 has a depth sufficient to allow the connector body to move laterally (e.g., end-to-end) on the support pin 900. For example, the lip 847 may be moved closer to and further from the cavity wall 859.

In an exemplary embodiment, the support pin 900 includes a head 910 and a base 912 opposite the head 910. The head 910 may be threaded such that the support pin 900 may be threadably coupled to the mounting frame 804. The support pin 900 includes a shoulder 914 between the head 910 and the base 912. The shoulder 914 is configured to bottom out against a stop surface 916 in the slot 902. The support pin 900 is loaded into the slot 902 until the shoulder 914 engages the stop surface 916. The base 912 passes through the side wall 854 into the recess 850. The base 912 extends into the slot 864. The slot 864 is oversized relative to the support pin 900 to allow a limited amount of floating movement of the connector body 826 relative to the support pin 900 within the recess 850, such as in a first lateral direction (e.g., side-to-side) and/or a second lateral direction (e.g., end-to-end) both being perpendicular to the mating direction.

Figure 18:
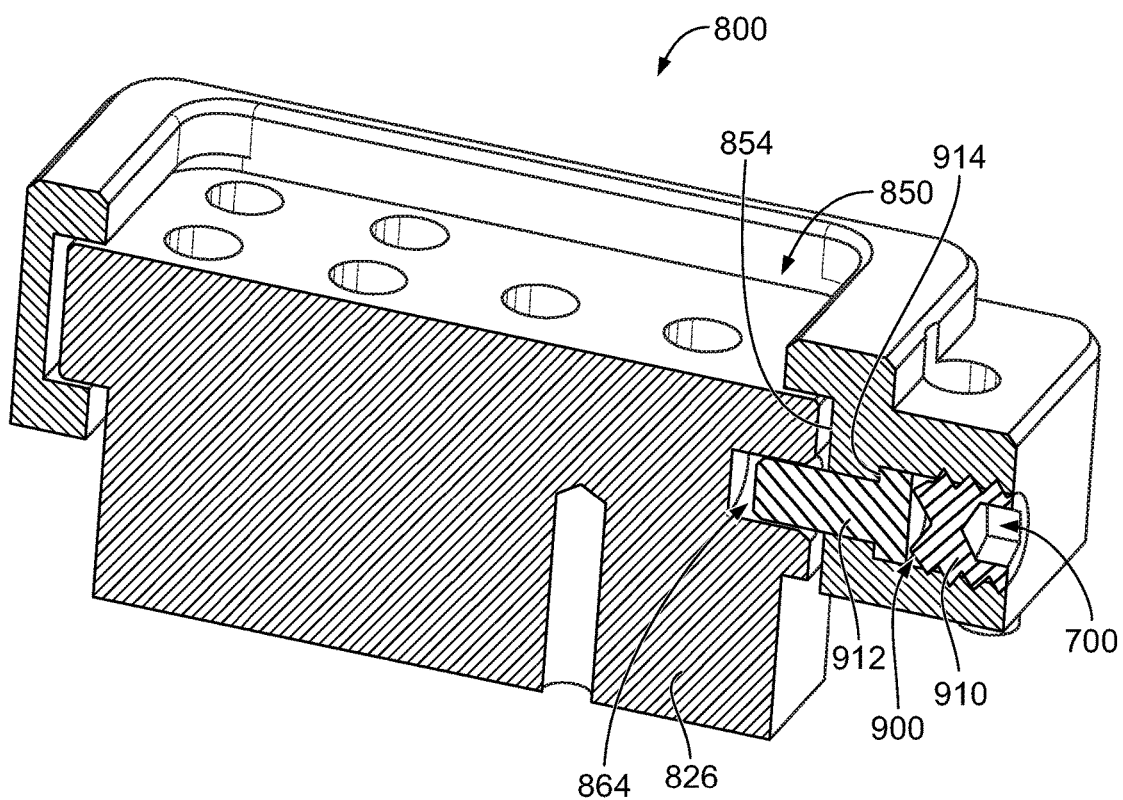
FIG. 18 is a sectional view of the coaxial connector assembly in accordance with an exemplary embodiment.

FIG. 18 is a sectional view of the connector assembly 800 in accordance with an exemplary embodiment. In the illustrated embodiment, the side support 700 is a two-piece side support. The support pin 900 includes the head 910 and the base 912, which are separate and discrete components of the support pin 900. For example, the head 910 is a threaded set screw configured to be threadably coupled to the mounting frame 804. The base 912 includes the shoulder 914. The base 912 passes through the side wall 854 into the recess 850 to interface with the connector body 826. The base 912 extends into the slot 864 of the connector body 826. The slot 864 is oversized relative to the support pin 900 to allow a limited amount of floating movement of the connector body 826 relative to the support pin 900 within the recess 850, such as in a first lateral direction (e.g., side-to-side) and/or a second lateral direction (e.g., end-to-end) both being perpendicular to the mating direction.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112(f), unless and until such claim limitations expressly use the phrase "means for" followed by a statement of function void of further structure.

What is claimed is:

1. A coaxial connector assembly comprising:
   a connector module having a connector body extending between a front side and a rear side, the connector body having side edges between the front side and the rear side, the side edges including a first side edge including a first slot in the first side edge located between the front side and the rear side, the connector body having contact channels therethrough between the front side and the rear side, the contact channels holding coaxial contacts in corresponding contact channels, the coaxial contacts being presented along the front side for engaging corresponding mating contacts of a mating connector, the front side facing in a mating direction along a mating axis;
   a mounting frame having a passage extending between a mating side and a mounting side of the mounting frame that face in opposite directions, the mounting frame having side walls between the mating side and the mounting side, the side walls including a first side wall including a second slot located between the mating side and the mounting side, the side walls including a second side wall having a blocking surface supporting the connector body in the passage, the mounting side facing in a mounting direction along the mating axis and configured to interface with a support wall, the passage having a recess that receives the connector body, the second slot being open to the recess; and a side support removably received in the first and second slots, the side support having a side support surface, the side support passing through the second slot and extending into the first slot such that the side support surface supports the first side edge of the connector body in the passage;

wherein the blocking surface of the mounting frame and the side support surface of the side support define a confined space oversized relative to the connector module to allow a limited amount of floating movement in the confined space in a lateral direction that is perpendicular to the mating axis.

2. The coaxial connector assembly of claim 1, wherein the connector module is rear loaded into the recess to engage the blocking surface of the mounting frame.

3. The coaxial connector assembly of claim 1, wherein the connector module is loaded into the recess prior to coupling the side support to the mounting frame, the side support holding the connector module in the recess after the side support is coupled to the mounting frame.

4. The coaxial connector assembly of claim 1, wherein the side support is a backing plate coupled to the mounting side of the mounting frame.

5. The coaxial connector assembly of claim 1, wherein the second slot is open at the mounting side of the mounting frame to receive the side support at the mounting side.

6. The coaxial connector assembly of claim 1, wherein the second slot is closed at the mating side and is closed at the mounting side, the second slot being open at the first side wall to receive the side support in a loading direction perpendicular to the mating axis.

7. The coaxial connector assembly of claim 1, wherein the side support is a support pin having a head and a base, the head being secured to the first side wall, the base extending from the first side wall into the recess and the first slot to interface with the first side edge of the connector body and support the first side edge of the connector body.

8. The coaxial connector assembly of claim 1, wherein the side support is a support pin extending through the second slot of the first side wall of the mounting frame into the first slot of the first side edge of the connector body, the first slot being oversized relative to the support pin to allow a limited amount of floating movement of the connector body relative to the support pin within the recess.

9. The coaxial connector assembly of claim 8, wherein the connector body is movable in a first lateral direction relative to the support pin perpendicular to the mating axis relative to the support pin.

10. The coaxial connector assembly of claim 9, wherein the connector body is movable in a second lateral direction relative to the support pin, the second lateral direction being perpendicular to the first lateral direction, the second lateral direction being perpendicular to the mating direction.

11. The coaxial connector assembly of claim 1, wherein the connector body includes a rear section and a forward section that are discrete elements, the forward section sized and shaped to be positioned within the recess and the rear section extending rearward of the mounting side, the rear and forward sections include respective contact cavities that align with each other to form the contact channels, wherein the contact cavities of the rear section are defined by base surfaces that face in the mating direction, the coaxial contacts including biasing springs positioned within the contact cavities of the rear section, the biasing springs being compressed between the corresponding base surfaces and flanges of the corresponding coaxial contacts.

12. The coaxial connector assembly of claim 1, wherein the coaxial contacts are spring-loaded such that the coaxial contacts are permitted to move along the mating axis.

13. A coaxial connector assembly comprising:

a connector module having a connector body extending between a front side and a rear side, the connector body having side edges between the front side and the rear side, the side edges including a first side edge including a first slot in the first side edge located between the front side and the rear side, the connector body having contact channels therethrough between the front side and the rear side, the contact channels holding coaxial contacts in corresponding contact channels, the coaxial contacts being presented along the front side for engaging corresponding mating contacts of a mating connector, the front side facing in a mating direction along a mating axis;

a mounting frame having a passage extending between a mating side and a mounting side of the mounting frame that face in opposite directions, the mounting frame having side walls between the mating side and the mounting side, the side walls including a first side wall including a second slot located between the mating side and the mounting side, the side walls including a second side wall having a blocking surface supporting the connector body in the passage, the mounting side facing in a mounting direction along the mating axis and configured to interface with a support wall, the passage having a recess that receives the connector body, the second slot being open to the recess, wherein the mounting frame includes a cavity at a second side wall of the mounting frame bounded by a front rim, a rear rim and a cavity wall between the front rim and the rear rim, the rear rim defining the blocking surface of the mounting frame, the connector body including a lip captured in the cavity by the front rim, the rear rim and the cavity wall; and a side support removably received in the first and second slots, the side support having a side support surface, the side support passing through the second slot and extending into the first slot such that the side support surface supports the first side edge of the connector body in the passage.

14. The coaxial connector assembly of claim 13, wherein the blocking surface of the mounting frame and the side support surface of the side support define a confined space oversized relative to the connector module to allow a limited amount of floating movement in the confined space in a lateral direction that is perpendicular to the mating axis.

15. The coaxial connector assembly of claim 13, wherein the connector body is pivoted into the recess with the lip being loaded into the cavity prior to the first side edge of the connector body being loaded into the recess, the side support being coupled to the mounting frame and the connector body after the first side edge is pivoted into the recess.

16. A coaxial connector assembly comprising:

a connector module having a connector body extending between a front side and a rear side, the connector body having side edges between the front side and the rear side, the side edges including a first side edge including a first slot located between the front side and the rear side, the first slot being a bore in the first side edge, the connector body having contact channels therethrough between the front side and the rear side, the contact channels holding coaxial contacts in corresponding contact channels, the coaxial contacts being presented along the front side for engaging corresponding mating contacts of a mating connector, the front side facing in a mating direction along a mating axis;

a mounting frame having a passage extending between a mating side and a mounting side of the mounting frame that face in opposite directions, the mounting frame having side walls between the mating side and the mounting side, the side walls including a first side wall including a second slot located between the mating side and the mounting side, the second slot being a bore in the first side wall, the side walls including a second side wall having a blocking surface supporting the connector body in the passage, the mounting side facing in a mounting direction along the mating axis and configured to interface with a support wall, the passage having a recess that receives the connector body, the second slot being open to the recess; and a support pin removably received in the bores of the first and second slots, the support pin having a side support surface engaging the connector body and supporting the connector body in the recess, the support pin passing through the second slot into the first slot to support the connector body in the recess, wherein the first slot is oversized relative to the support pin to allow a limited amount of floating movement of the connector body relative to the support pin within the recess.

17. The coaxial connector assembly of claim 16, wherein the connector module is loaded into the recess prior to coupling the support pin to the mounting frame, the support pin holding the connector module in the recess after the support pin is coupled to the mounting frame.

18. The coaxial connector assembly of claim 16, wherein the support pin includes a head and a base, the head being secured to the first side wall, the base extending from the first side wall into the recess and the first slot to interface with the connector body and support the first side edge within the recess.

19. The coaxial connector assembly of claim 18, wherein the first slot is oversized relative to the support pin in a first lateral direction relative to the support pin and in a second lateral direction relative to the support pin, the first lateral direction, the second lateral direction and the mating direction being mutually perpendicular directions.

20. A communication system comprising:
a first coaxial connector assembly comprising a first connector module having a first connector body holding first coaxial cable assemblies having mating contacts having mating ends terminated to ends of cables; and a second coaxial connector assembly comprising:
a second connector module having a second connector body holding second coaxial cable assemblies having coaxial contacts having mating ends terminated to ends of cables configured to be mated with the mating contacts, the second connector body extending between a front side and a rear side, the second connector body having side edges between the front side and the rear side, the side edges including a first side edge including a first slot located between the front side and the rear side, the first slot being a bore in the first side edge, the second connector body having contact channels therethrough between the front side and the rear side, the contact channels holding corresponding coaxial contacts;

a mounting frame having a passage extending between a mating side and a mounting side of the mounting frame that face in opposite directions, the mounting frame having side walls between the mating side and the mounting side, the side walls including a first side wall including a second slot located between the mating side and the mounting side, the second slot being a bore in the first side wall, the side walls including a second side wall having a blocking surface supporting the second connector body in the passage, the mounting side facing in a mounting direction along the mating axis and configured to interface with a support wall, the passage having a recess that receives the second connector body, the second slot being open to the recess; and a support pin removably received in the bores of the first and second slots, the support pin having a side support surface engaging the second connector body and supporting the second connector body in the recess, the support pin passing through the second slot into the first slot to support the second connector body in the recess, wherein the first slot is oversized relative to the support pin to allow a limited amount of floating movement of the connector body relative to the support pin within the recess.

* * * * *